US008361297B2

(12) United States Patent
Mayer et al.

(10) Patent No.: US 8,361,297 B2
(45) Date of Patent: Jan. 29, 2013

(54) BOTTOM-UP ASSEMBLY OF STRUCTURES ON A SUBSTRATE

(75) Inventors: Theresa S. Mayer, Port Matilda, PA (US); Christine D. Keating, State College, PA (US); Mingwei Li, Santa Rosa, CA (US); Thomas Morrow, State College, PA (US); Jaekyun Kim, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 534 days.

(21) Appl. No.: 12/351,509

(22) Filed: Jan. 9, 2009

(65) Prior Publication Data

US 2009/0242405 A1   Oct. 1, 2009

Related U.S. Application Data

(60) Provisional application No. 61/020,429, filed on Jan. 11, 2008, provisional application No. 61/116,922, filed on Nov. 21, 2008.

(51) Int. Cl.
*B01D 57/02* (2006.01)
*G01N 27/453* (2006.01)

(52) U.S. Cl. ......... 204/547; 204/643; 257/204; 977/880

(58) Field of Classification Search .................. 204/547, 204/643; 257/202–211; 977/880
See application file for complete search history.

(56) References Cited

U.S. PATENT DOCUMENTS

| | | | |
|---|---|---|---|
| 5,620,854 A | 4/1997 | Holzrichter et al. | |
| 6,159,742 A | 12/2000 | Lieber et al. | |
| 6,287,765 B1 | 9/2001 | Cubicciotti | |
| 6,459,095 B1 | 10/2002 | Heath et al. | |
| 6,687,987 B2 | 2/2004 | Mayer et al. | |
| 6,803,840 B2 | 10/2004 | Kowalcyk et al. | |
| 7,067,341 B2 | 6/2006 | Mascolo et al. | |
| 2002/0117659 A1 | 8/2002 | Lieber et al. | |
| 2002/0167374 A1 | 11/2002 | Hunt et al. | |
| 2003/0215865 A1 | 11/2003 | Mayer et al. | |
| 2003/0234465 A1 | 12/2003 | Chen et al. | |
| 2004/0011650 A1* | 1/2004 | Zenhausern et al. | 204/547 |
| 2004/0211271 A1 | 10/2004 | Han et al. | |
| 2007/0114457 A1 | 5/2007 | Han et al. | |
| 2007/0275396 A1* | 11/2007 | Zheng | 435/6 |

OTHER PUBLICATIONS

Evoy, S., et al., "Dielectrophoretic assembly and integration of nanowire devices with functional CMOS operating circuitry", Microelectronic Engineering, vol. 75, Jul. 2004, p. 31-42.*
S. Lee, R. Bashir, Dielectrophoresis and Chemically Mediated Directed Self-Assembly of Micrometer-Scale Three-Terminal Metal Oxide Semiconductor Field-Effect Transistors, *Advanced Materials*, 2005, 17, 2671-2677.
T. Morrow, M. Li, J. Kim, T. Mayer, C. Keating, "Programmed Assembly of DNA-Coated Nanowire Devices," Science, vol. 323, No. 5912, p. 352, Jan. 16, 2009.
M. Li, R. Bhiladvala, T. Morrow, J. Sioss, K. Lew, J. Redwing, C. Keating, T. Mayer, "Bottom-up assembly of large-area nanowire resonator arrays," Nature Nanotechnology, vol. 3, p. 88-92, Feb. 2008.

* cited by examiner

*Primary Examiner* — J. Christopher Ball
(74) *Attorney, Agent, or Firm* — Gifford, Krass, Sprinkle, Anderson & Citkowski, P.C.

(57) ABSTRACT

Examples of the present invention include methods of assembling structures, such as nanostructures, at predetermined locations on a substrate. A voltage between spaced-apart electrodes supported by substrate attracts the structures to the substrate, and positional registration can be provided the substrate using topographic features such as wells. Examples of the present invention also include devices, such as electronic and optoelectronic devices, prepared by such methods.

29 Claims, 22 Drawing Sheets

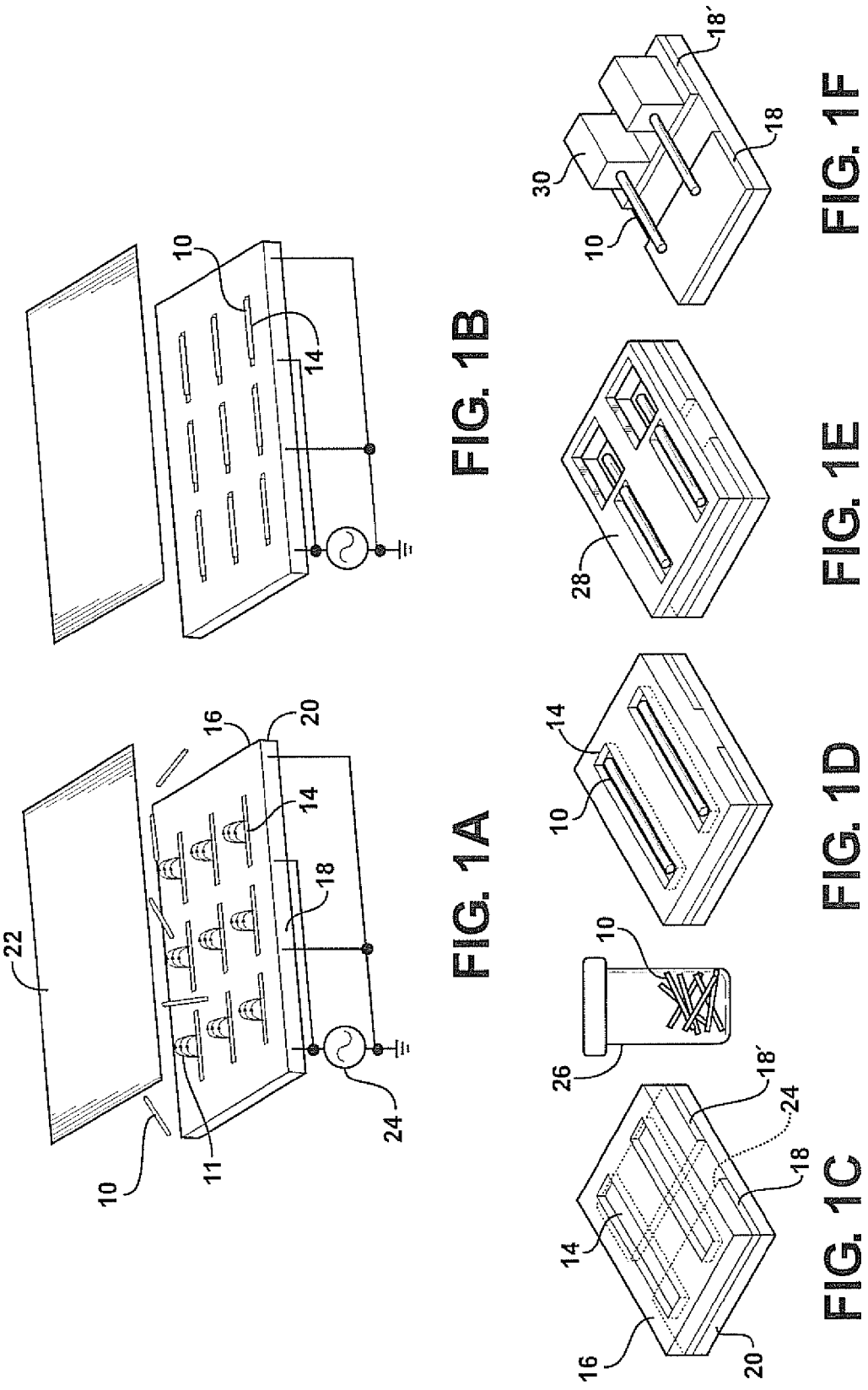

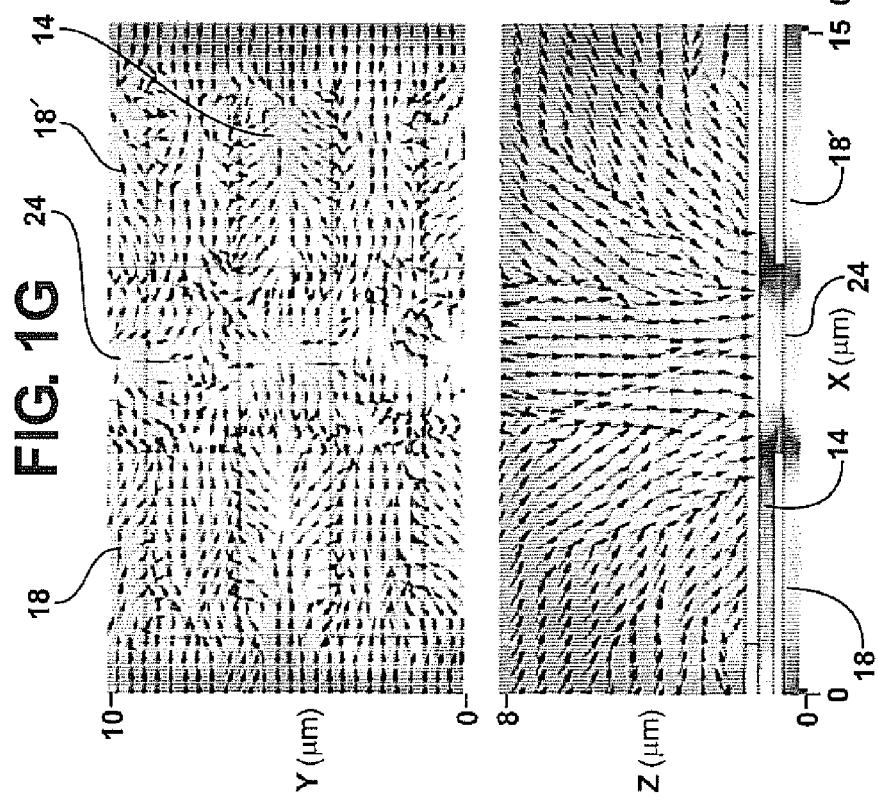
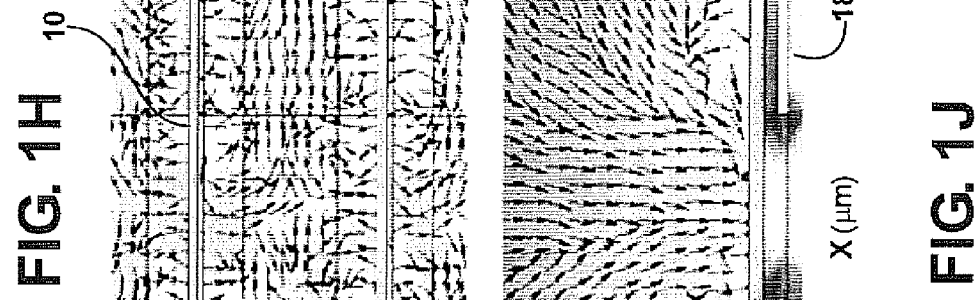
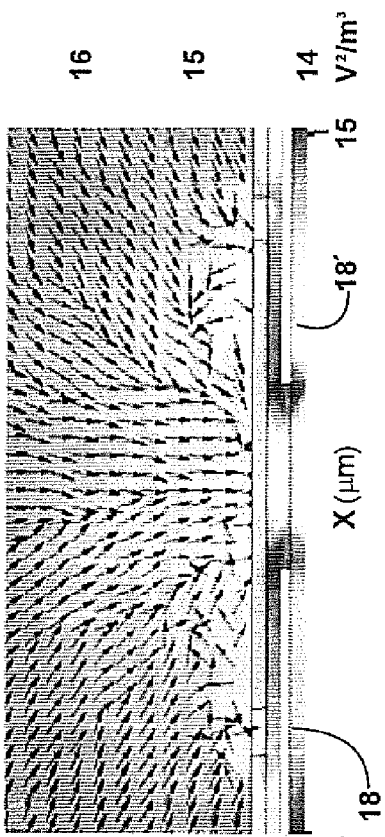
FIG. 1H
FIG. 1G
FIG. 1J
FIG. 1I

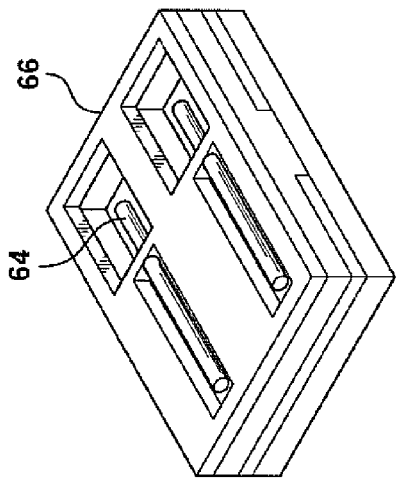
FIG. 3C
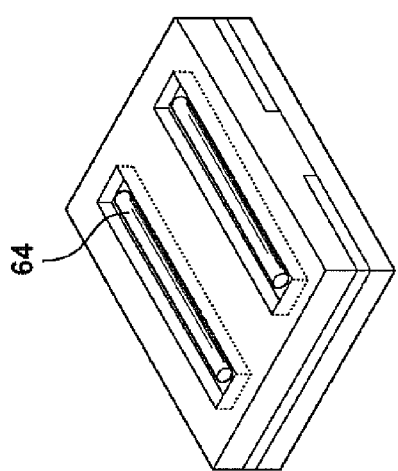
FIG. 3B
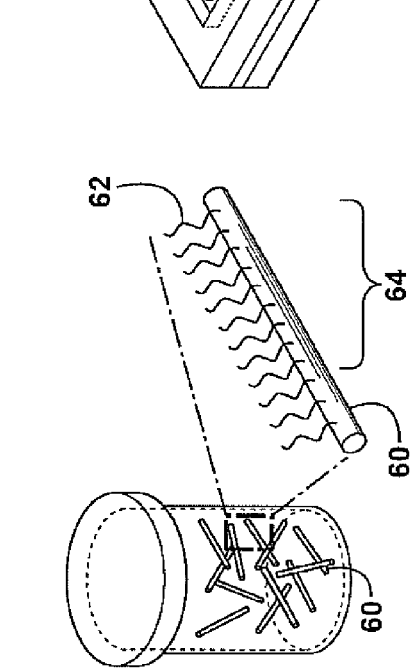
FIG. 3A
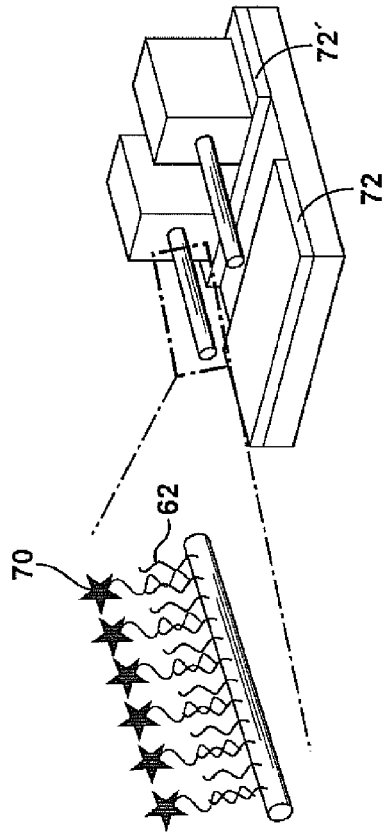
FIG. 3E
FIG. 3D
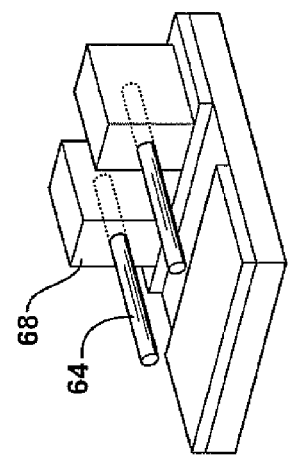

FIG. 3F   FIG. 3G   FIG. 3H   FIG. 3I

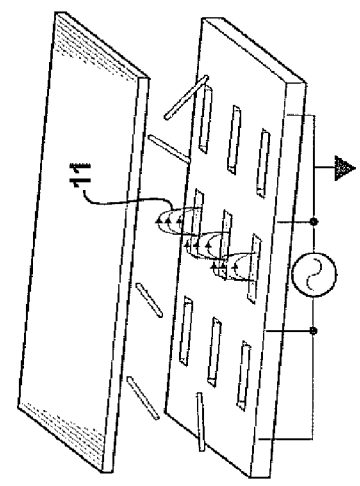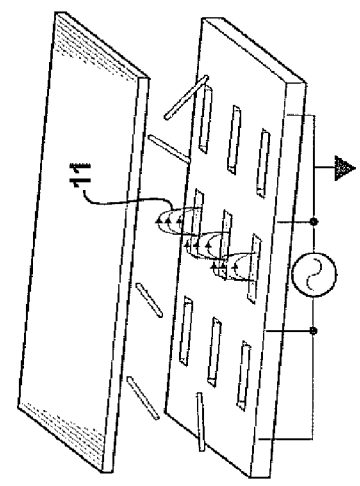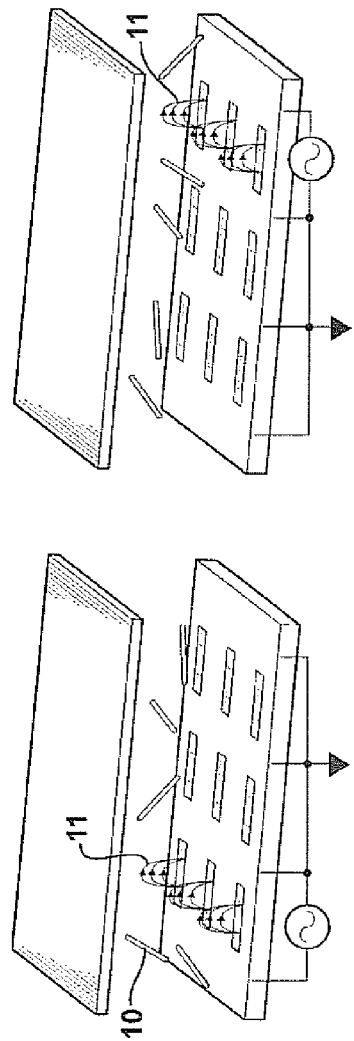
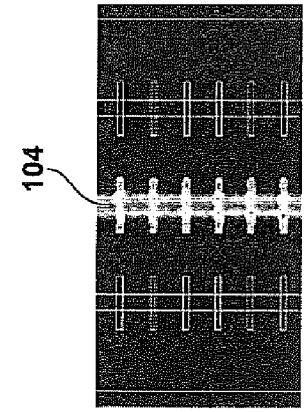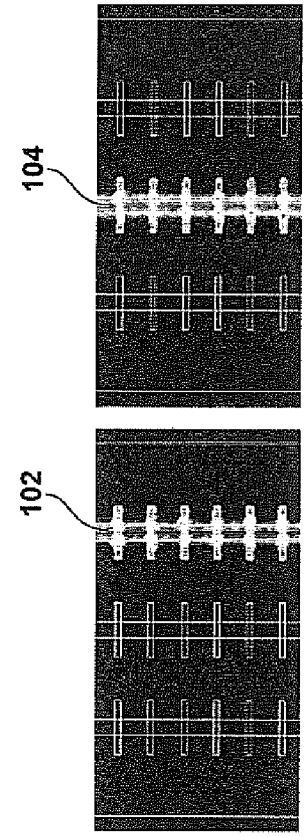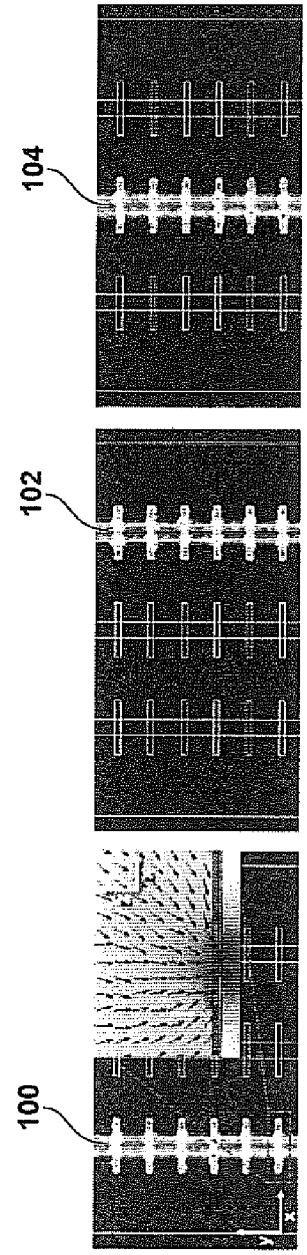

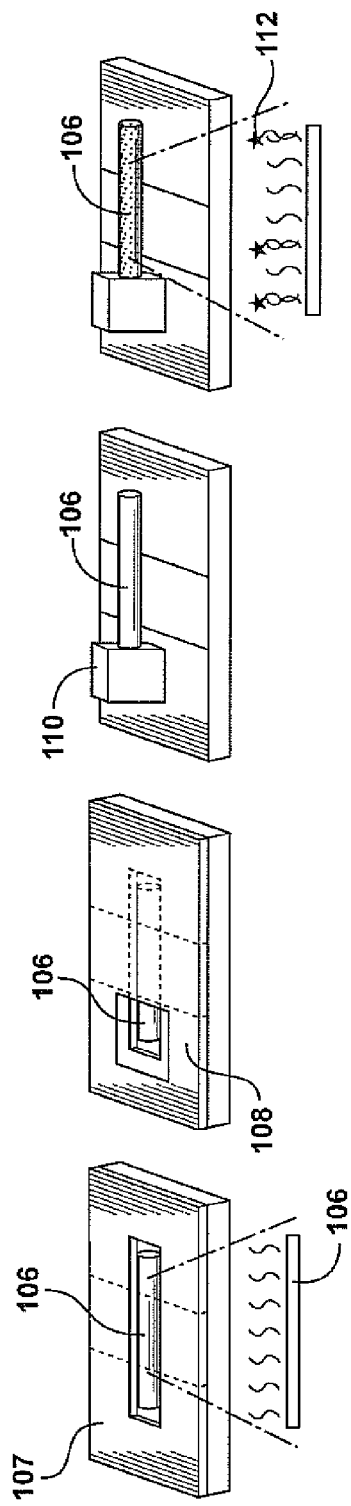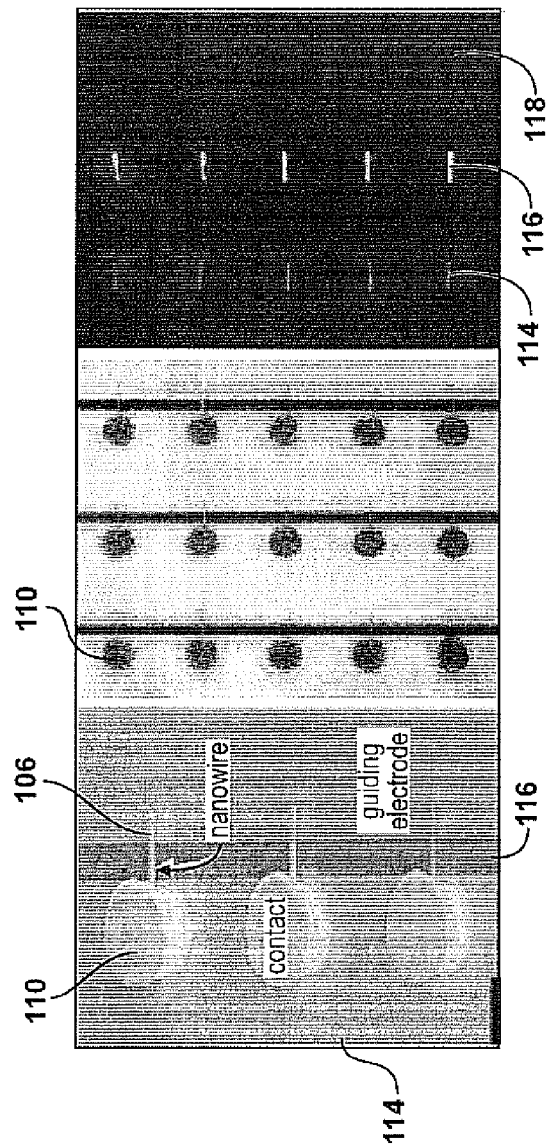
FIG. 4G  FIG. 4H  FIG. 4I  FIG. 4J
FIG. 4K  FIG. 4L  FIG. 4M

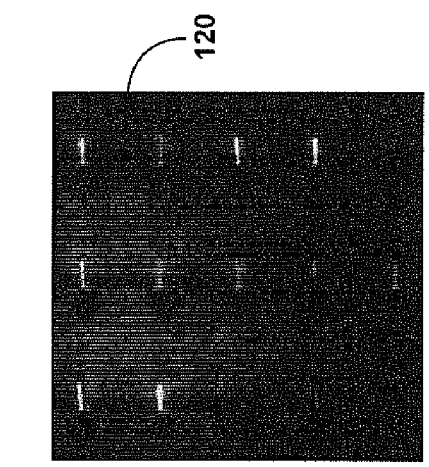
FIG. 4O
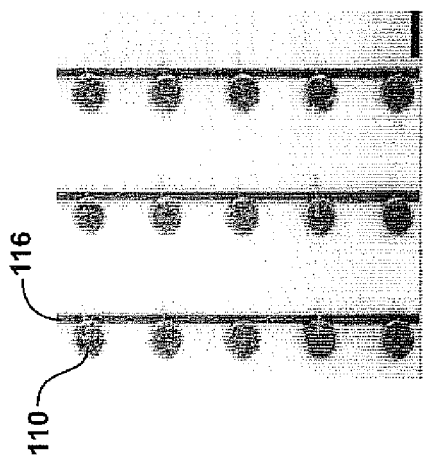
FIG. 4N
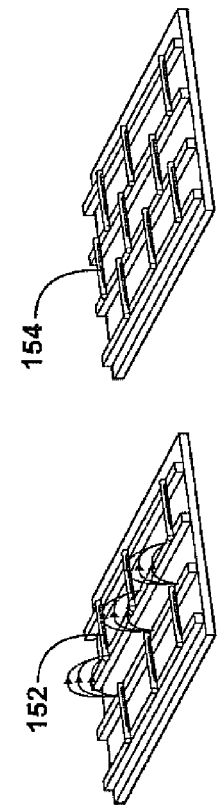
FIG. 5D
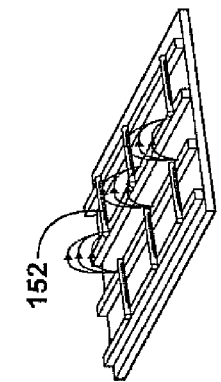
FIG. 5C
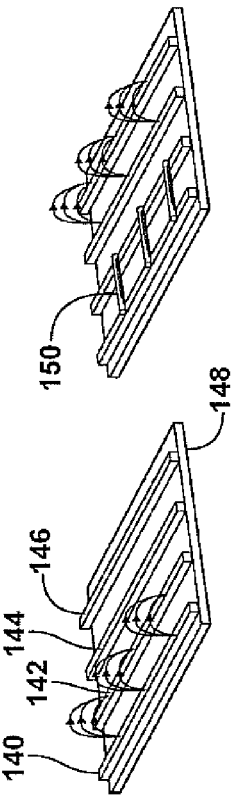
FIG. 5B
FIG. 5A

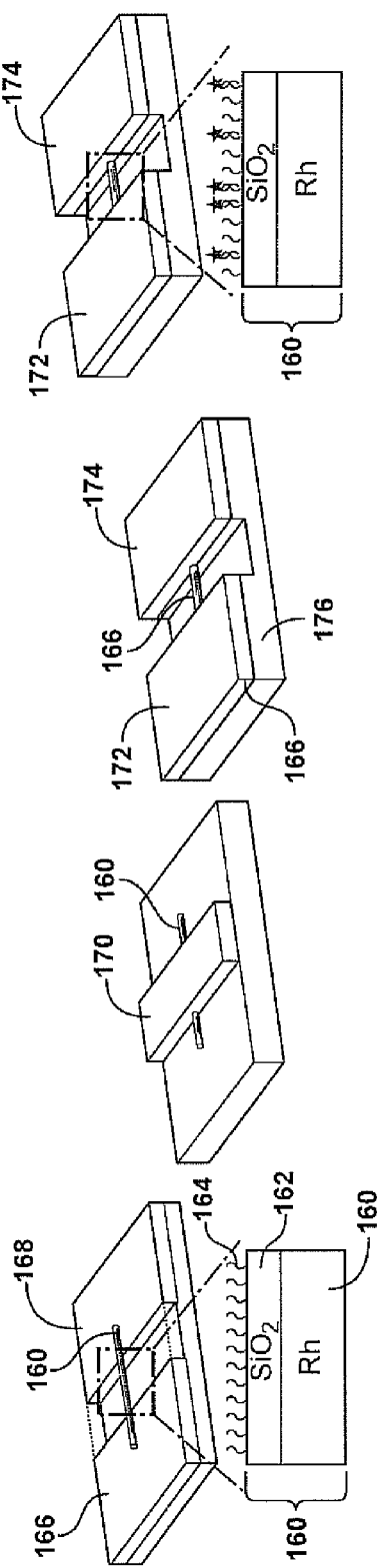
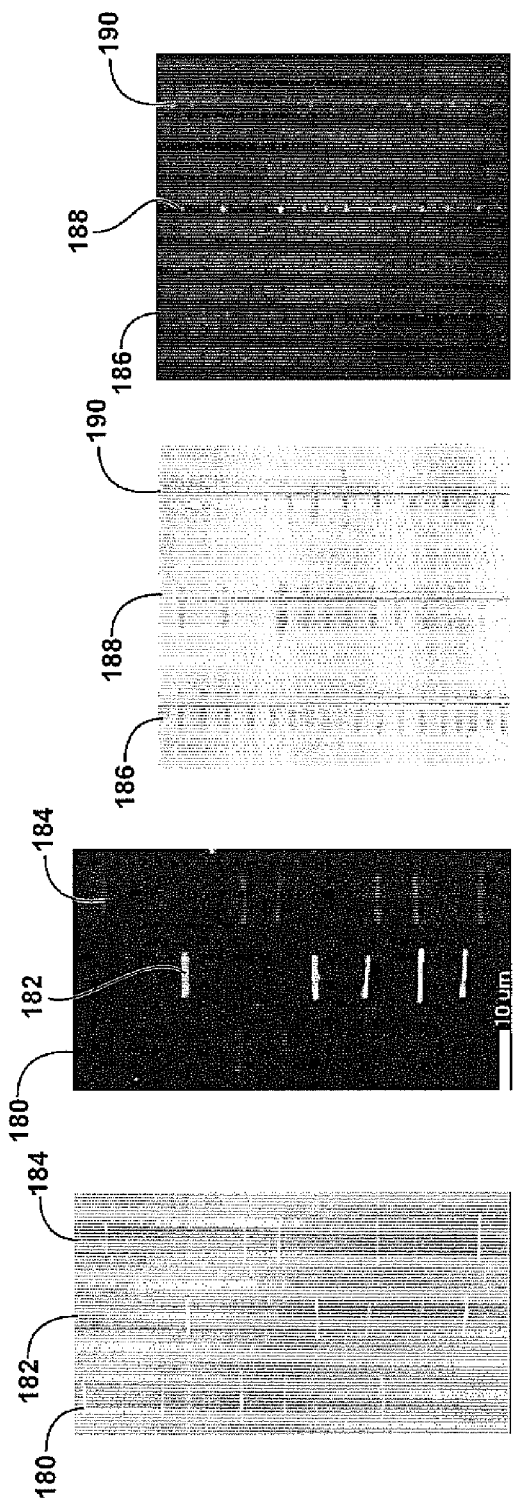

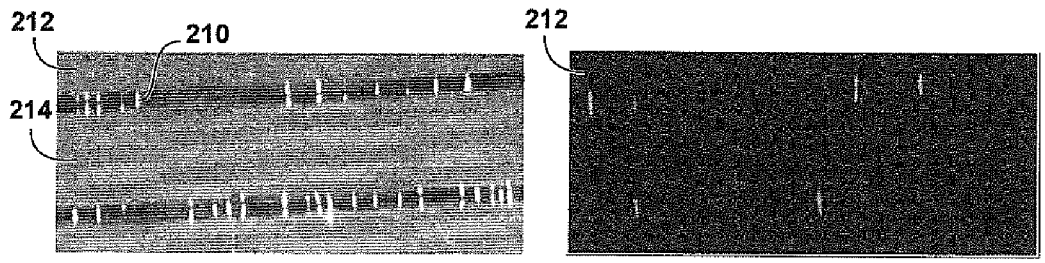
FIG. 6B     FIG. 6C
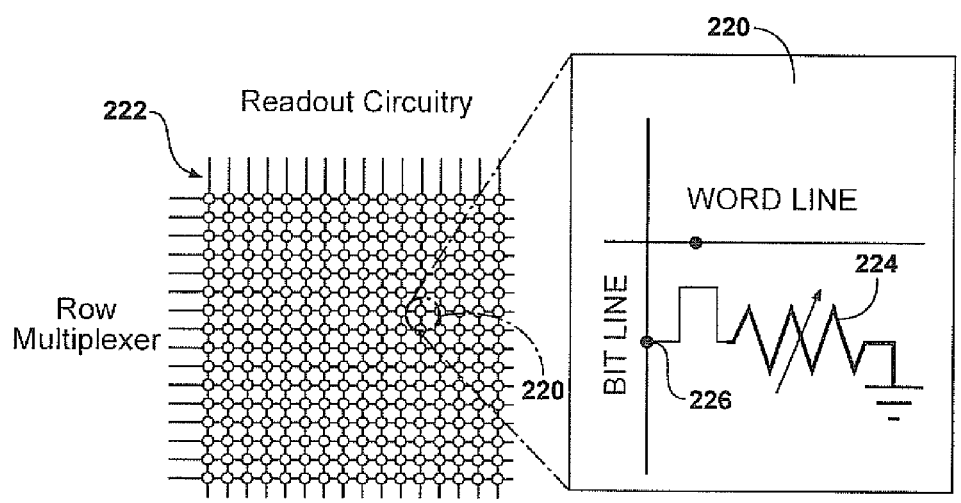
FIG. 7A     FIG. 7B

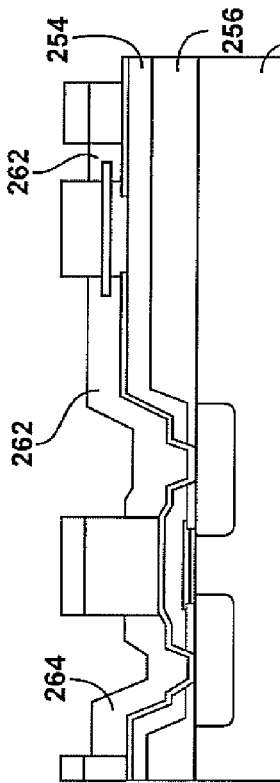
FIG. 7D
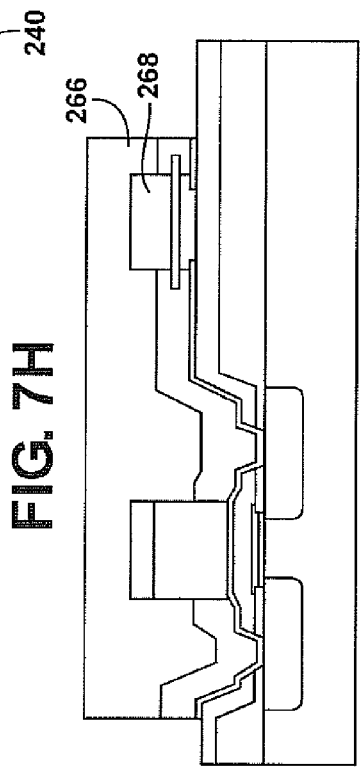
FIG. 7E
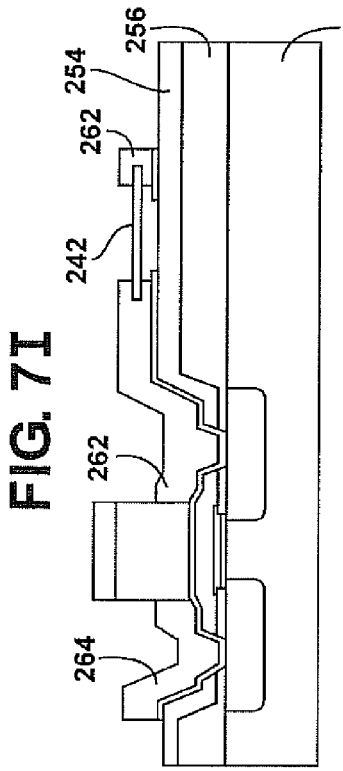
FIG. 7F
FIG. 7G
FIG. 7H
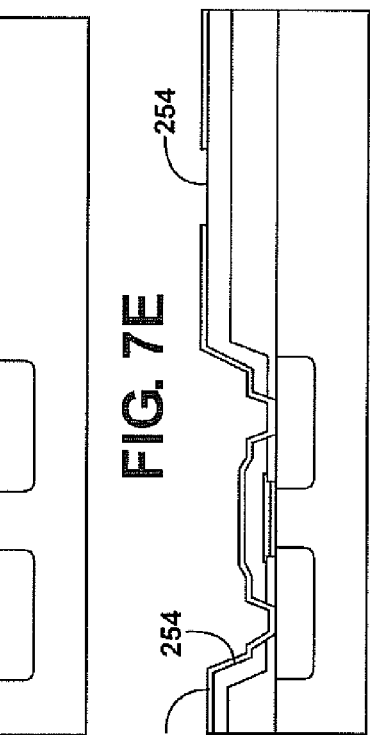
FIG. 7I
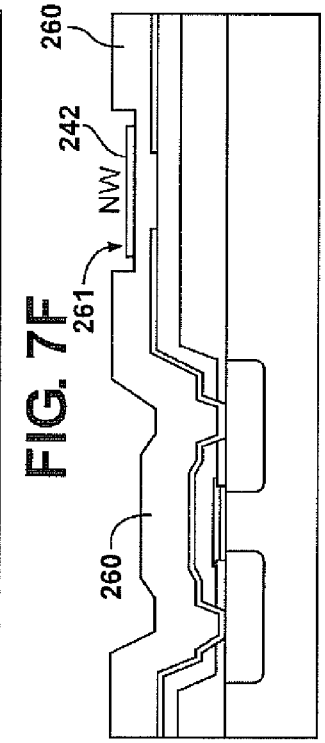
FIG. 7J

FIG. 16A  FIG. 16B

BOTTOM-UP ASSEMBLY OF STRUCTURES ON A SUBSTRATE

REFERENCE TO RELATED APPLICATIONS

This application claims priority from U.S. provisional patent application Ser. No. 61/020,429, filed Jan. 11, 2008 and U.S. provisional patent application Ser. No. 61/116,922, filed Nov. 21, 2008, the contents of which are incorporated herein by reference.

This invention was made with government support under Grant Nos. ECS50303981, DMR0213623, CCR0303976 and CHE0304575, awarded by the National Science Foundation, and Grant Nos. CA118591 and EB000268, awarded by the National Institutes of Health. The government has certain rights in the invention.

BACKGROUND OF THE INVENTION

Nanostructured and microstructured devices have numerous applications. However, conventional fabrication techniques may have various problems and limit the capability of such devices. Hence, there is a great demand for improved devices and methods of fabrication.

SUMMARY OF THE INVENTION

Novel programmed directed assembly methods for positioning and integrating different populations of micro/nanostructure devices (such as nanowires, nanodisks, and the like) at predetermined locations on a substrate were developed. In example methods, the structures are first synthesized under optimized conditions and dispersed in a delivery medium (such as a liquid) prior to their assembly on the substrate.

Examples discussed in this specification include various examples of positioning nanostructures on a substrate. However, examples of the invention are not limited to the assembly of nanostructures, but also include assembly of microstructures, and in some examples larger structures. The term nanostructure is used in several examples for illustrative convenience, but examples referring to nanostructures can also be used for larger structures such as microstructures. As used herein, a microstructure may be a structure having at least one dimension less than 1 mm, in some examples less than 500 microns, and may in some examples include nanostructures. A nanostructure may be a structure having at least one dimension less than 1 micron.

A substrate can include pre-existing electronic circuitry, such as functional silicon complementary metal-oxide-semiconductor (CMOS) transistors, other electronic circuitry, electronic components of any kind, electrode patterns for nanostructure assembly and/or for electrical contact with assembled nanostructures, additional components assembled using other techniques, electromagnetic sources (such as optical sources, lasers, and the like), detectors, or other components. A combination of programmable spatially-confined electric-field forces, depressions patterned in a sacrificial layer on the substrate, and capillary forces are used to control the global and local position of each structure on the substrate, and to provide submicron registration accuracy between each individual structure and a specific device feature on the substrate.

Following assembly, the individual structures positioned within each patterned depression are mechanically and electrically connected, either individually or in groups, to specific features on the substrate, such as the source or drain electrode of an individual nanoscale CMOS transistor, using top-down manufacturing approaches. In this method, any structure that is not positioned within a depression, and is misaligned relative to features on the substrate, is not mechanically connected to the substrate and is lifted off when the sacrificial material is dissolved. The structure material, geometry, and post assembly processing are used to define the specific device that is created onto the substrate. Using this method, more than one type of material and/or device may be monolithically integrated onto the substrate. This programmed directed assembly approach can deliver high densities of e.g. micro/nanostructure devices in excess of $10^6/cm^2$ with population mismatch densities of less than 1% and overall defect densities of less than 5%. This method may enable the fabrication of a wide range of multi-component heterogeneously integrated microsystems. In some examples, groups of individual nanostructures can be connected together, for example as chains inside a depression within the substrate surface.

Nanostructures, such as nanowires, may be synthesized and chemically functionalized off-chip, allowing a wide range of different types of nanostructure to be used. Representative examples describe the use of nanowires, but examples of the present invention are not limited to nanowires. The directed assembly and subsequent post-assembly fabrication steps may be designed to prevent the exposure of the nanostructures to harsh chemical and thermal treatments, making them compatible with pre-existing functional circuitry on the substrate, chemically-functionalized nanowires such as those used in biosensor arrays, or conducting polymer nanowires such as those used in chemical sensor arrays, as well as other materials and coatings.

Examples of the present invention include arrays in which nano or microstructures are coated with or fabricated from chemical or biological moieties such as polymers, nucleic acids, or proteins. Applications for such arrays include chemical and biological sensing. These may be prepared using nanowires having biological and/or chemical functionality, such as molecular recognition or selective binding functionality.

In a representative example, PNA (peptide nucleic acid) or DNA probe molecules were attached to nanowires prior to array assembly. Three populations of DNA or peptide nucleic acid (PNA)-coated nanowires, in which the DNA or PNA sequence differed between the different populations, were assembled onto a chip with submicron positioning control over each individual nanowire, as described above, and with control over which population of nanowires could be assembled in different regions of the chip. Post assembly top down fabrication methods, including photolithography and electroplating, were used to simultaneously convert the three populations of DNA or PNA-coated nanowires into a high density array of cantilevered resonator devices. The DNA or PNA probe molecules attached to the nanowires prior to their assembly bound selectively to complementary oligonucleotide targets following device fabrication.

Novel approaches of the present invention allow expansion of the range of nanostructure materials, geometries, and surface chemistries that can be integrated on a substrate such as a silicon chip.

In another representative example, a dense array of template-synthesized poly-ethylenedioxythiophene (PEDOT) conducting polymer nanowires was assembled onto a functional MOS transistor circuit. A dense cross-point array of MOS access transistors was fabricated on a silicon substrate. The top level interconnect metal level was used to define the guiding electrodes that supply the sinusoidal AC voltage for nanowire assembly. A sacrificial dielectric material with patterned microwells registered to provide alignment with individual access transistors on the circuit was deposited on top of the guiding electrodes. Electric-field assisted assembly was used to position individual nanowires within the microwells, and post assembly top down fabrication was used to electrically and mechanically connect each individual nanowire assembled within a microwell to an access transistor on the silicon chip. This produced an individually addressed array of conducting polymer nanowires, which can be used for chemical sensing.

Other representative examples include directed assembly of arrays of micron-wide Au sheets and graphene sheets (or tiles). A single graphene tile was assembled on top of a lithographically patterned metal back gate. The ends of the tile were connected to metal source and drain contacts.

In other representative examples, nano-electro mechanical systems (NEMS) devices comprising arrays of nanowire resonators were fabricated on a silicon chip substrate. Electric field forces, capillary forces, and a nanowire lift-off process were combined to give high-yield positioning of over 2000 individual nanowires in an array. Using this method, silicon and rhodium resonators were prepared with uniform and reproducible clamps, and operated in the linear regime with vacuum Q-factors of ~4500 and 1100, respectively. A shift in the resonance frequency of cantilevered silicon resonators was used to detect binding of as few as two 20 nm diameter gold nanoparticles.

In another representative example, individual PEDOT nanowires were used to produce chemically-sensitive resistive (chemoresistors) devices. Template synthesized PEDOT nanowires with ClO4 and PSS dopants were contacted by electroplated gold contacts, and were sensitive to volatile organic compounds. Individual PEDOT-ClO$^4$ nanowire chemoresistors were sensitive to concentrations of methanol as low as 100 ppm, which is comparable to the best PEDOT chemoresistive thin film sensors.

As another representative example, oxide-coated n+–p–n+ and p+–n–p+ silicon nanowires grown by the vapor liquid solid technique were integrated into wrap-around-gate metal oxide semiconductor field effect transistors (MOSFETs). The VLS-grown doped source/drain MOSFETs exhibited complementary MOSFET transfer characteristics with high $I_{ON} > 10^{-6}$ A and $I_{ON}/I_{OFF} > 10^7$.

An example method of assembling structures at predetermined locations on a substrate, comprises providing spaced-apart electrodes supported by substrate, providing positional registration on the substrate using topographic features, exposing the substrate to a fluid suspension of the structures, applying an alternating voltage between the spaced-apart electrodes so as to attract the structures towards the substrate, the topographic features locating the structures at the predetermined locations. The structures may have at least one dimension less than 500 microns, for example being microstructures having at least one dimension between 1 micron and 500 microns, or nanostructures having at least one selected dimension less than 1 micron. Example structures include disks, wires, tubes, rings, sheets, and the like. Selected dimension(s) may include one or more of the following: a diameter, thickness, width, length, or an average value of a size parameter for an irregular form.

In some examples, the structures are nanostructures having at least one dimension (such as length and/or diameter) of less than 1 micron.

An alternating voltage applied across an electrode gap creates an electric field that attracts structures to the substrate through a dielectrophoretic force. Structures may have a shape anisotropy of at least 2:1, and in some examples this may be much greater, such as 10:1, particularly for nanowires. In some examples, spaced-apart alignment electrodes include a pair of electrodes having an electrode gap, the pair of electrodes being covered by a dielectric layer. The dielectric layer may prevent electrical contact between the alignment electrodes. A structure can be centered relative to the electrode gap by short-range capacitive forces when the structure is proximate or adjacent the dielectric layer.

The topographic features may include depressions within the substrate, such as elongate wells having an elongation direction, the electric field being applied generally parallel to the elongation direction. The wells may be configured to receive the structures in a desired structure orientation. An electric field can applied so as to align the structures in a preferred orientation relative to the substrate, and if the structures are elongate, the electric field may align the structures to be generally parallel with the elongation direction of the wells.

Topographic features may be formed using a patterned resist layer on the substrate, and structures may be connected to the substrate only if the structures are at the predetermined locations. Structures not at a predetermined location may be removed by a lift-off process. Connection of structures to the substrate may include the formation of mechanical connections and/or electrical connections to the substrate, for example an electrical connection to an electrode on the substrate. An electrical connection may be formed between a structure and at least one of the spaced-apart electrodes, and/or with other electrodes or devices also on the substrate.

Spaced-apart electrodes may be provided by interdigitated electrodes. For selective area deposition of structures, allowing different species of structure to be assembled selectively within an area of the substrate, electrodes may be individually controlled (through amplitude and/or phase) to provide attractive electrical forces within the selected area, and negligible electrical forces elsewhere.

A substrate may include electronic components, and the topographic features used to positioning the structures relative to the electronic components. A positional accuracy of approximately 1 micron or less has been achieved. A substrate may be a silicon substrate, and may include CMOS electronic components.

Structure assembly methods can be used to provide an array of analyte-sensitive elements on the substrate, for biochemical and/or chemical sensors. Using selective area assembly, different species can be assembled on the same substrate. An array of structures may have a surface density of at least 1,000,000 elements per square centimeter.

Structures may include wires, disks, tubes, rings, spheroids (such as prolate or oblate spheroids), spirals, dendrites, sheets, tiles, plates, and the like. Substrates may comprise one or more substrate materials such as semiconductors, inorganic dielectrics, glasses, ceramics, polymers, other nonmetal, or other material.

A selective area assembly method of assembling structures at predetermined locations on a substrate, the structures including at least a first structure species and a second structure species, comprises providing a plurality of electrodes supported by substrate, exposing the substrate to the first structure species, applying a first alternating voltage to a first set of electrodes, so as to assemble the first structure species at a first set of predetermined locations, and applying a second alternating voltage to a second set of electrodes, so as to assemble the second structure species at a second set of predetermined locations. This approach can be used to assemble, for example, different functionalized species on a common substrate using electric field control. A representative example includes deposition of one or more non-silicon based semiconductor elements (such as III-V or II-VI (chalcogenide) semiconductors) on silicon, avoiding lattice matching problems.

Functionalization of the structures can be performed previous to the assembly process, before exposing the substrate to a fluid suspension of the structure species. This is useful for assembling structures on delicate substrates, such as substrates including an integrated circuit. Examples of the present invention also allow provision of an electrical interface between biomolecules and electronic circuitry (e.g. including inorganic semiconductors), for example for assay and analyte-detection applications.

Structures may be grown (e.g. by epitaxial growth) on a different substrate, and subsequently removed and a suspension prepared. This allows lattice-matched substrates to be used to prepare semiconductor structures, which then can be assembled (as one or more species, possibly differing in composition and bandgap) on the substrate. Examples of the present invention include optoelectronic devices such as emissive displays, multi-color LED assemblies, multi-color laser assemblies, and multi-wavelength sensors. For example, improved image sensors can be used by assembling structures sensitive to different wavelength bands on a common substrate. This allows improved efficiency wavelength sensitive sensors to be prepared.

Molecular (such as biomolecular) coatings on the structures can be prepared prior to their assembly. In a specific example, this was performed with DNA coatings to prepare functionalized structures Examples of the invention include devices such as resonators, field effect transistors, light emitting devices, radiation detection devices, and analyte sensors such as chemoresistive sensors. Examples include multiplexed arrays of individually-addressable nanostructure devices. In specific examples, peptide nucleic acid probe molecules attached to nanowires prior to assembly maintained their binding selectivity during, and recognized complementary oligonucleotide targets after a resonator array was assembled.

BRIEF DESCRIPTION OF THE FIGURES

FIGS. 1A-1F illustrate a novel hybrid nanowire device array integration method;

FIGS. 1G-1J show plots of electric field distributions;

FIGS. 3A-3E illustrate the fabrication of SiO2-coated Rh nanowire resonator arrays and selective binding of oligonucleotide targets;

FIGS. 3F-3I shows bright-field (FIGS. 3F and 3H) and fluorescence FIGS. 3G and 3I) optical microscope images of resonators;

FIGS. 4A-4O illustrate a novel method to position multiple nanowire populations in specific regions of a substrate with submicron registration accuracy to existing device features on the substrate;

FIGS. 5A-5L show programmed directed assembly perform on substrates without microwells;

FIGS. 6A-6C illustrate the compatibility of the electric-field assisted assembly method to a sandwich hybridization assay;

FIGS. 7A-7C show a schematic of an example multiplexed cross-point nanosensor array;

FIGS. 7D-7J illustrate a back end process flow used to electrically and mechanically connect assembled individual nanowires to a functional silicon MOS access transistor;

FIGS. 16A-16C show an example of a wrap-around-gate silicon nanowire field effect transistor and electrical properties.

DETAILED DESCRIPTION OF THE INVENTION

Figure 2A:
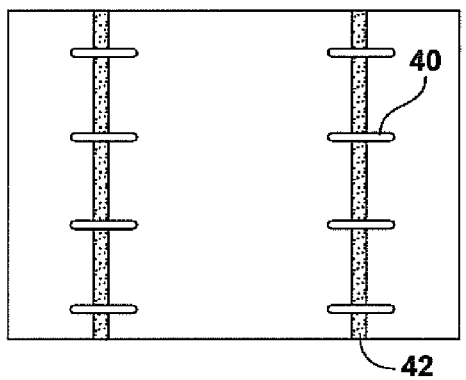
FIGS. 2A-2D illustrate fabricated Rh nanowire resonator arrays.

A novel bottom-up assembly method was developed to fabricate large-area arrays of nanostructure-based devices. The nanostructures, such as nanowires, may be synthesized and chemically functionalized before integration onto a substrate such as a silicon chip, and can be precisely located at predetermined locations on the substrate. Assembly methods have general applicability, and can be used with various nanostructured materials.

A nanostructure may comprise one or more materials. Example nanostructures may comprise: a metal (e.g. a multi-segment metal nanowire); semiconductor; magnetic material; dielectric material (such as an oxide dielectric), piezoelectric material, glass, ceramic, and the like. Nanostructures may have geometries such as a nanowire (including a rod, hollow tube, flat belt, and the like), nanodisk, or other form.

Example devices were prepared having 2000 single-nanowire nano-electro-mechanical system (NEMS) resonators. Two types of cantilevered resonators were integrated using silicon and rhodium nanowires, and had Q-factors of ~4500 and ~1100, respectively, in vacuum. These examples show that bottom-up nanowire assembly is a practical alternative to top-down fabrication for numerous applications such as sensitive chip-based detection.

FIGS. 1A-1F illustrate a novel hybrid nanowire device array integration method that combines deterministic bottom-up nanowire assembly with conventional top-down microfabrication. Directed assembly is used to position individual nanowires at lithographically-defined locations on a silicon chip for fabricating multiplexed arrays.

In representative examples, electric-field forces, capillary forces, and nanowire lift-off are combined to achieve high-yield nanowire integration over cm-scale chip areas. As illustrated in FIG. 1A, arrays of wells 14 are patterned in a sacrificial insulating photoresist layer 16 that cover the interdigitated metal guiding electrodes 18 defined on the surface of the substrate 20 (e.g. a chip surface). Electrodes may be in parallel spaced apart pairs, with topographic features used for positional registration, such as wells in a photoresist layer. In some examples, electrodes may be further coated with a dielectric layer.

FIG. 1A illustrates the directed assembly process. A suspension of nanowires 10 is injected between a cover slip 22 and a Si substrate 20 that is coated with a sacrificial photoresist layer 16 containing an array of patterned microwells 14, while a sinusoidal alternating voltage is applied between pairs of interdigitated guiding electrodes using a voltage source 24. Individual nanowires are preferentially assembled and aligned within the patterned microwells by long-range dielectrophoretic and short-range capacitive forces. The figure illustrates the electric field lines 11 generated across a gap between spaced-apart electrodes using the voltage source.

FIG. 1B shows the nanowires 10 arrayed within the predetermined locations defined by the wells 14.

FIG. 1C shows in closer view the Si substrate 20 coated with a sacrificial photo-resist layer 16 containing an array of lithographically patterned microwells 14. The wells extend across a gap 24 between electrodes 18 and 18'. The microwells may be registered to existing device features on the Si substrate. FIG. 1C also shows a suspension of nanowires 10 synthesized off chip in container 26. This is not to scale.

FIG. 1D shows electric-field forces are used to preferentially align individual nanowires 10 within the microwells 14 patterned in a sacrificial photoresist layer. FIG. 1E shows individual contact windows are defined in a second photoresist layer 28. FIG. 1F shows metal contacts 30 electrodeposited around the nanowire tips. Both layers of photoresist are dissolved to lift-off any misaligned (uncontacted) nanowires. This integration method facilitates future electrical connection of individual nanowires to underlying device features that comprise Si circuitry.

FIGS. 1G and 1H show plots of log $\nabla|E|^2$, which is proportional to the dielectrophoretic force, at an X-Y plane sliced at 50 nm above the photoresist layer before (FIG. 1G) and after (FIG. 1H) nanowire assembly. FIGS. 1I and 1J each show a plot of log $\nabla|E|^2$ at X-Z plane sliced along the length of nanowire before (1I) and after (1J) nanowire assembly. Arrows indicate the direction of the dielectrophoretic force. The highest electric field intensity regions are inside the microwells. This produces electric field gradients, and hence long-range dielectrophoretic forces, that preferentially attract and align individual nanowires in the microwells. The figures show the behavior of the field close to the electrode gap.

An alternating voltage in the kHz range was applied between the guiding electrodes to produce spatially confined electric fields that polarize nanowires in suspension. Long-range dielectrophoretic forces induced by the field gradients attract the nanowires to the surface and align them along the electric field gradient. Individual nanowires are further centered in the electrode gaps by short-range capacitive forces between the nanowires and guiding electrodes. The nanowires that are preferentially aligned in the wells are retained there by capillary forces produced during evaporation of the suspending liquid within each well (FIGS. 1A-B and 1C, see also FIG. 2A).

A smaller number of nanowires are misaligned outside of the microwells, as shown at 40 in the optical microscope image of FIG. 2A. Long-range forces may be considered those acting over greater distances than the electrode separation (the electrode gap is shown at 42), or greater than a small multiple (e.g. 3x) of the nanostructure dimensions.

Figure 2B:
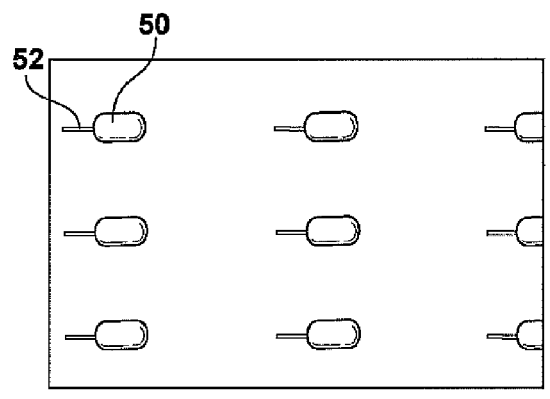
Figure 2C:
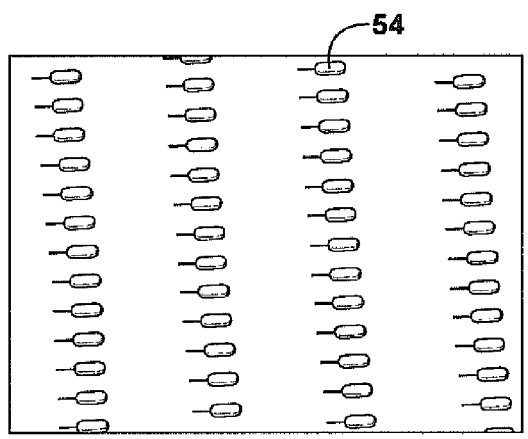
Figure 2D:
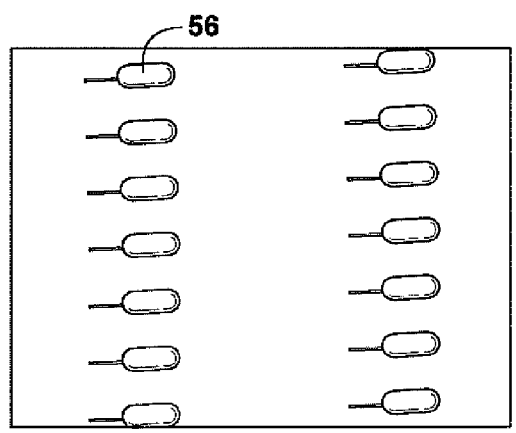

FIG. 2B-2D illustrate fabricated Rh nanowire resonator arrays. The scale bars in FIG. 2C and FIG. 2D are 20 and 10 µm, respectively. These figures are FE-SEM images of RhNW resonator arrays showing high yield of individual nanowire positioned at predefined locations on the chip.

FIG. 2B shows example cantilevered nanowire resonator devices 50 fabricated using metallic rhodium (Rh) nanowires 52 synthesized off-chip. The Rh nanowires 52 were electrodeposited within the pores of anodic aluminum oxide membranes, and released from the membrane by selective etching. The nanowires are polycrystalline with an average grain size of 5 nm.

However, assembly methods according to embodiments of the present invention are quite general and can be extended to other nanowires or other nanostructured materials, nanostructure geometries, and NW devices.

Nanowire device integration was completed by electrode-positing a thick metal mechanical and electrical contact at one end of the nanowires aligned in each well and dissolving the photoresist layers. This is accomplished by patterning a window to define the metal contact in a second photoresist masking layer. The pattern is transferred into the sacrificial photoresist to expose the nanowire tips and the unmasked regions of the guiding electrodes. Gold metal is electrodeposited in the open windows until it completely surrounds the nanowire tips and reaches the top surface of the second photoresist layer.

The photoresist is dissolved to lift-off any nanowires that are misaligned outside of the patterned microwells. This leaves parallel arrays of free-standing individual nanowire de-vices (FIG. 2B-FIG. 2D) as shown in the optical and field-emission scanning electron microscope (FE-SEM) images of FIG. 2B (at 52) and FIG. 2C-2D at 54 and 56 respectively.

Typical defects include missing and multiple nanowires (aggregates or end-to-end chains), which occur in nearly equal numbers using our laboratory-scale nanowire synthesis, de-livery, and assembly procedures. Despite these defects, high yields of well-aligned individual nanowires assembled in arrays containing over 2000 resonators were observed to be ~80%; even higher device yields are expected by implementing more controlled and optimized nano-manu-facturing processes.

In an example approach, interdigitated guiding metal electrodes (20-nm Ti/60-nm Au) were patterned on a (100) Si substrate protected by 1 micron thermally-grown SiO2 layer using a metal lift-off process. The substrate was then coated with 1 µm of deep-ultraviolet (DUV) photoresist (PMGI-SF-11, MicroChem Corp.) and arrays of wells were patterned to a depth of 500-nm. 10 µL of the nanowire suspension was injected between the substrate and a cover slip that was held 1 mm above the surface by spacers. A 7 Vrms, 10 kHz sinusoidal voltage was applied between the guiding electrodes to align the nanowires across the electrode gaps. The nanowires preferentially assembled into the wells due to the higher field strength in these regions (e.g. as shown in FIG. 1D and FIG. 2A).

The metal contact windows were patterned in a second 1-micron layer of photoresist (Shipley 1811, Shipley Corp.), and transferred into the PMGI by DUV flood exposure and removal in developer (PMGI-101, Microchem Corp.) leaving the nanowire tips and underlying metal electrodes exposed. The metal contacts were electrodeposited (TG-25 RTU, Technic Inc.) in the windows using the assembly electrode as the working electrode. A deposition rate of ~0.1 micron/min was obtained a pulsed current of Ipeak=1 mA at a duty cycle of 0.6/0.3 ms. The cantilevered nanowires were released by dissolving both layers of photoresist (Microposit 1165, MicroChem Corp.), rinsing the chip in DI water followed in ethanol, and drying the chip in a critical point dryer to prevent the nanowires from adhering to the substrate. Nanowires mis-aligned outside of the wells were also lifted-off when the photoresist is dissolved. (FIG. 2B and FIGS. 2C-2D). The metal contact provides a direct electrical connection between the chip and conductive nanowires, which can be used for multiplexed electrical addressing of individual nanowires in an array.

Biological and Chemical Sensor Arrays

Nanowire assembly and subsequent fabrication steps can be chosen to eliminate the use of high temperatures and harsh chemicals, malting this process compatible with chemically-functionalized nanowires used in biological and chemical sensor arrays. This allows attachment of molecules to the nanowire surfaces under optimized conditions off-chip, followed by assembly of the nanowires into arrays on the chip, for example as shown in FIG. 3A.

Peptide nucleic acid (PNA) probe molecules designed to selectively detect oligonucleotide sequences found in the genomes of hepatitis C (HCV) or hepatitis B (HBV) viruses were covalently attached to different batches of SiO2-coated Rh nanowires prior to on-chip integration.

FIGS. 3A-3E illustrate the fabrication of $SiO_2$-coated Rh nanowire resonator arrays and selective binding of oligonucleotide targets. FIG. 3A illustrates functionalization of nanowires 60 using chemical or biochemical coating 62, to give functionalized nanowires 64. FIG. 3B shows assembly of the functionalized nanowires 64, in the manner of FIG. 1D. FIG. 3C shows deposition of a second patterned resist layer 66, corresponding to layer 28 in FIG. 1E. FIG. 3D shows fixed-free resonators 68. FIG. 3E illustrates interaction with an analyte 70, and the resonance may be detected electrically (for example using electrodes 72 and 72', also used for the assembly process. A piezoelectric element may also be included.

FIGS. 3F-3I shows bright-field (FIGS. 3F and 3H) and fluorescence (FIGS. 3G and 3I) optical microscope images of resonators 80 and 82 formed from nanowires (84 and 86) coated with different PNA probe sequences for HCV and HBV after exposure to fluorescently-labeled oligonucleotides complementary only to HCV probe. A fluorescence signal 88 is observed for the complementary probe (FIG. 3I), and very little fluorescence for the noncomplementary probes, indicating that the probe PNA maintains its binding selectivity throughout the fabrication process.

Dark-field optical microscope images showed Rh nanowires preferentially aligned in photoresist wells after solvent evaporation. Misaligned nanowires outside of the wells are not attached to the Si chip by the electrodeposited Au clamp and will be lifted-off when the photoresist is dissolved. Dark-field optical microscope image of integrated nanowire resonator arrays after the photoresist is dissolved showed that only the nanowires aligned in the wells remain on the wafer. This results in high device integration yields.

The use of fluorescent labeling facilitates imaging of the fabricated devices. How-ever, example devices are not limited to positioning of fluorescently-labeled nanostructures on a substrate. Nanostructures may be labeled or otherwise functionalized to give any desired response to an analyte, for example molecular binding and/or changes in electrical, magnetic, optical, chemical, and/or other properties.

These representative results show that peptide nucleic acid probe molecules, attached to the nanowires prior to assembly, maintain their binding selectivity, and recognize complementary oligonucleotide targets once the resonator array is assembled. PNA probe molecules can be applied to mass-based nucleic acid detection using nanowire resonators such as those described here. Other example devices include biosensors based on conductance changes of nanowire field effect transistors.

Covalent Attachment and Hybridization of PNA

Covalent attachment of peptide nucleic acid (PNA) to the $SiO_2$-coated Rh nano-wires was based on previously reported methods. PNA sequences used were 5'-Cys-GAG TAG TGT T-EE-3' and 5'-Cys-CTC AAT CTC G-EE-3', where E denotes the solubility enhancer [(2-Amino-ethyl)-(2-{[bis-(2-methoxy-ethyl)-carbamoyl]-methoxy}-acetyl)-amino]-acetic acid. Here, sulfosuccinimidyl 4-[N-maleimidomethyl] cyclohexane-1-carboxylate (sulfo-SMCC) was used to crosslink the amino group on 3-aminopropyltrimethoxy silane (APTMS) to the thiol on the cysteine residue synthesized onto the 5' end of the PNA sequences (Biosynthesis Inc). PNA attachment was achieved by mixing 100 µL of the silica/sulfo-SMCC coated RhNWs suspended in 300 mM NaCl 10 mM Na phosphate (PBS) with 100 µL of the 20 µM PNA solution for 24 hours while vortexing. The NWs were washed three times with PBS then three times with ethanol.

Hybridization of 5'-Alexa Fluor 488-TTC GCG ACC CAA CAC TAC TC-3' target DNA (Integrated DNA technologies) was performed after NW assembly and integration by incubation with 0.4 µM of the appropriate DNA in PBS at 25° C. for ~15 hours, followed by rinsing in PBS. This sequence is complementary to one of the two probe PNA sequences (5'-Cys-GAG TAG TGT T-EE-3'). Although HCV is an RNA virus, a DNA oligonucleotide was used as a mimic of this portion of the HCV sequence here.

Probe molecules retain binding selectivity throughout the assembly and integration process.

Programmed Assembly of Different Populations of Nanowire Devices

Fabricating electronic devices using multi-level photolithography provides excellent control of feature geometry and registration between layers, but each deposition step incorporates just one material, from a limited set, over the entire chip. Alternatively, device components such as nanowires can be synthesized from many different materials and even coated with biological molecules prior to assembling them onto a chip. However, it is still challenging to accurately position the various nanowires into different locations on the chip.

An example directed assembly approach that overcomes this limitation uses forces generated by programmable electric fields to direct different populations of biofunctionalized nanowires to specific regions of the chip, while providing accurate registry between each individual nanowire and the photolithographic features within that region. Sequential injections of nanowires carrying different DNA sequences are synchronized with a programmed, spatially-confined electric field profile that directs nanowire assembly. Nanowire-bound DNA are able to selectively bind complementary targets following assembly and device fabrication, which makes this process compatible with conventional integrated circuit manufacturing.

FIGS. 4A-4O illustrate a novel method to position multiple nanowire populations in specific regions of a substrate with submicron registration accuracy to existing device features on the substrate.

Examples of this approach allow monolithic integration, including the assembly of thin film semiconductor devices and other materials.

FIGS. 4A-C show an example programmed directed assembly process. Suspensions of nanowires carrying different DNAs were injected sequentially, while 4 V, 1 MHz sinusoidal voltages were applied between different pairs of guiding assembly electrodes. Nanowires were directed to microwells in a particular column. DNA oligonucleotides complementary to human pathogenic sequences were attached covalently to different batches of nanowires (8 microns, ~$10^9$ wires/mL). Aliquots were sequentially injected across a dense two-dimensional array of photolithographically defined microwells superimposed across gaps separating guiding electrodes used for programmed assembly. The assembly process of FIGS. 4A-4C is similar to that discussed above in relation to FIGS. 1A-1B. However, in this case the application of the electric field between spaced-apart electrodes is spatially modulated. In this way, sequential introduction of differently functionalized nanostructures allows assembly of the different species at different sets of predetermined locations.

FIGS. 4D-4F show simulated spatial electrical field profile during assembly. Contour plots show $\nabla|E|^2$ measured at the surface of the microwells for the peak value of voltage applied in (A). The inset of FIG. 4D shows a cross-sectional view of one microwell, plotted as $\log_{10}\nabla|E|^2$; arrows indicate the dielectrophoretic force. Electric field calculations with sinusoidal voltages applied between specific pairs of guiding electrodes showed that the field strength is highest in the microwells that span the biased electrodes and negligible elsewhere. The guiding assembly electrode design and magnitude and phase of the sinusoidal voltage were optimized to minimize stray electric fields in regions of the chip where nanowire assembly was not desired. Hence, FIG. 4D shows a first nanowire population (or species) assembled in the leftmost row 100, FIG. 4E shows a second species assembled in the rightmost row 102, and FIG. 4F shows a third species assembled in the central row 104.

Electric field gradients induced long-range dielectrophoretic forces that directed individual nanowires only to the biased microwells in <1 min. Electrostatic forces centered the wires across the gaps, and capillary forces pushed them against the sides of the wells; this fixed the position of nanowire tips and their pitch, respectively.

FIGS. 4G-4J show post-assembly device integration. FIG. 4G shows a functionalized nanowire 106 within a well within resist layer 107, FIG. 4H shows deposition of a second resist layer 108, FIG. 4I shows fabrication of a resonator formed using contact 110, and FIG. 4J shows interaction of the functionalized nanowire 106 of the resonator with an analyte 112. Other details are similar to those discussed for FIG. 1C-FIG. 1F.

After all batches were assembled, an array of nanowire resonator devices was fabricated by forming contacts to each nanowires. Windows registered to microwells were opened in photoresist. Au contacts were electrodeposited, and additional processing, e.g. oxide removal, is possible. Dissolving the photoresist left nanowire devices; these were incubated with DNA. Scale=5 µm.

FIGS. 4K-4M show scanning electron microscope images (4K), optical reflectance images (4L) and fluorescence images (4M) after resonator device integration and incubation with labeled complementary targets. The scale bar represents 5 microns. Nanowires carrying different DNA probe sequences were assembled into three separate columns. The nanowires used were ~300 nm diameter wires, with a 20 nm $SiO_2$ shell to facilitate verification of DNA function by fluorescence. Submicron registration accuracy to patterned features on the substrate was achieved. After nanowire assembly and device integration, the entire chip was incubated with a mixture of DNA target sequences, each complementary to one of the nanowire-bound probes and labeled with a different dye. Each labeled target bound to wires in a different column, indicating successful nanowire assembly and retention of DNA binding selectivity despite exposure to electric fields, photoresist coatings, and solvents.

Almost no nanowires assembled into the wrong column (≦1%). The array had a 71% yield of individual nanowire devices in 750 potential sites (2.4×104 devices/cm2); defects included vacancies (19%) and multiples of the same nanowire type (9%). Submicron registration accuracy to features on the chip was achieved across the entire array. This allows direct electrical connection between each nanowire device and a dedicated transistor on an integrated circuit chip. This assembly approach, which is also compatible with smaller diameter nanowires, could be extended to more diverse materials or coatings, and alternative device structures such as field effect transistors that enable not only detection but also stimulation of biological events.

Nanowire synthesis and biofunctionalization was as follows. Rh nanowires (295±20 nm) were synthesized, coated with ~20 nm SiO2, and functionalized with DNA probes. DNA-coated nanowires (~1×109 wires in 1 mL 300 mM NaCl, 10 mM phosphate buffer, pH 7.4) were then rinsed by centrifugation/resuspension 3× with 50 µL deionized water, and 3× with ethanol, finally resuspending each sample to 50 µL in ethanol.

FEMLAB software was used to simulate the dielectrophoretic force distribution of four electrode strips embedded in the photoresist layer and the aqueous solution. The gradient of the square root of the electric field represents a measure of dielectrophoretic force exerted on the polarized nanowires.

Lithographically defined electrodes 114 (32 µm wide, 5 mm long and separated by a 3 µm gap 116) were fabricated by metal liftoff of 10 nm Ti, and 90 nm Au on 1 µm thermally grown SiO2 on a silicon (100) substrate. Microwells (3×11 µm, 20 µm pitch) were patterned ~250 nm into 1.0 µm PMGI SF-11 photoresist. Electrofluidic alignment of DNA functionalized nanowires was accomplished by applying a sinusoidal voltage (3 Vrms, 1 MHz). Nanowires functionalized with P1, P2 or P3 (Table 2 below), were further diluted (300-fold) with ethanol, and deposited on the substrate and positioned into the left, right, and middle microwell columns respectively, allowing the ethanol to evaporate after each set nanowires was assembled.

Following nanowire assembly Au contacts 110 were fabricated. Orotemp 24 RTU was electrodeposited for 15 min at −2.51 V vs. Pt gauze in a two electrode system forming the Au contacts. The photoresist layers 107 and 108 were removed by submerging the wafer in Micro-posit 1165 remover (15 min, 50° C.), then rinsed by submerging the wafer in deionized H2O, and isopropanol and allowed to air dry.

Non-specific binding to the chip was reduced by functionalizing exposed surfaces with a 5' thiolated 10 C sequence for one hour. Hybridization of T1, T2 and T3 to their respective DNA probe molecules was performed at 0.38 µM T1, T2, and T3 in PBS at room temperature for ~36 hours, after which wafers were rinsed in PBS and a coverslip added for imagine (1.4 NA, 60× objective). Fluorescence images were acquired sequentially at each chip location, and were false-colored and overlaid for viewing (Alexa488=blue, Alexa647=red, and TAMRA=green). FIG. 4M is a black-and-white reproduction of a color image in which all fluorescence signals in the left row 114 were blue, all signals in the center row 116 were green, and all in the right row 118 were red.

FIG. 4N shows a control in which DNA-coated nanowire populations were mixed prior to assembly onto the chip and wires carrying different probe sequences are randomly distributed between the columns of microwells. Scale bar=10 µm. This figure is similar to FIG. 4L, and need not be discussed further.

FIG. 4O shows fluorescence images from the control. The color original shows that the different fluorescence responses 120 (red, green, and blue, as discussed in relation to FIG. 4M) are randomly distributed over the substrate.

| Name | Sequence 5'→3' | Description |
|---|---|---|
| P1 | Thiol-TTTTTTTTTTGAGTAGTGTTGGGTCGCGAA | HCV[a] Probe |

-continued

| Name | Sequence 5'→3' | Description |
|---|---|---|
| P2 | Thiol-TTTTTTTTTTCCATCAATGAGGAAGCTGCA | HIV[b] Probe |
| P3 | Thiol-TTTTTTTTTTCTCAATCTCGGGAATCTCAA | HBV[c] Probe |
| T1 | Alexa Fluor 488-TTCGCGACCCAACACTACTC | HCV Target |
| T2 | Alexa Fluor 647-TGCAGCTTCCTCATTGATGG | HIV Target |
| T3 | Tamra-TTGAGATTCCCGAGATTGAG | HBV Target |

[a]HCV = hepatitis C virus;
[b]HIV = human immunodeficiency virus,
[c]HBV = hepatitis B virus.

Novel general approaches described in this specification can be further be used to make heterogeneously integrated Microsystems, such as a multiple analyte-target biosensor. However, the assembly techniques are very general and can be applied to many important micro-systems, such as opto-electronic devices, combining high power RF and low noise amplifiers with silicon monolithically, and other examples discussed further below.

FIGS. 5A-5L show the programmed directed assembly can also be performed on substrates without microwells; in this case wires go to appropriate columns but their submicron registration within the columns are not fixed.

FIGS. 5A-5D show programmable electric field guided assembly of a plurality of nanowire species without the use of topographic features such as wells. FIG. 5A shows a first electric field applied between electrodes 140 and 142. In this example, the substrate 148 is silicon nitride. FIG. 5B shows a first species of nanowire 150 assembled (in this example using the first electric field and without topographic features) between electrodes 140 and 142, and a second electric field now applied between electrodes 144 and 146. FIG. 5C shows a second species of nanowire assembled at 152 using the second electric field, and a third electric field applied between electrodes 142 and 144. FIG. 5D shows the third species of nanowire 154 assembled using the third electric field.

FIGS. 5E-5H show assembly of a chemoresistive element, and can also be used for assembly of a ChemFET or fixed-fixed resonator structure. This assembly process does not require topographic elements on the substrate. FIG. 5E shows a functionalized nanowire 160 aligned by an electric field applied between alignment electrodes 166 and 168, and now bridging the gap between the two electrodes. The functionalized nanowire 160 comprises a Rh-based nanowire with a silica outer coating 162 and a chemical functionalized surface coating 164. FIG. 5F shows application of a patterned photoresist layer 170.

FIG. 5G shows evaporated Ti layers 172 and 174 formed on the electrodes (such as 166), contacting the functionalized nanowire 160, supported by substrate layer 176. FIG. 5H further illustrates the chemoresistive element formed using functionalized nanowire 160. This approach can be combined with the approach of FIGS. 5A-5D to obtain multiple species of functionalized nanowires responsive to a plurality of analytes. Similar approaches can be used to form other electronic and/or optoelectronic devices.

FIG. 5I-J shows bright field reflectance (FIG. 5I) and overlaid fluorescence (FIG. 5J) images of nanowires after assembly across desired guiding electrodes, with no microwells or other surface topography used. Positioning of biomolecule coated Rh nanowires was achieved. Nanowires functionalized prior to assembly with probe molecules complementary to hepatitis C virus, human immunodeficiency virus, and hepatitis B virus were sequentially positioned into the left, right and middle gaps respectively (shown at 180, 182, and 184 respectively) by applying AC voltages across desired sets of electrodes, for example in the sequence shown in FIGS. 5A-5D. Following assembly fluorescently labeled target molecules labeled with Alexa Fluor 488, Alexa Fluor 647 and TAMRA were hybridized to their complementary PNA probe molecules (HCV, UV and BV respectively). The original images were colored (Alexa Fluor 488=Blue, TAMRA=Green, Alexa Fluor 647=Red), with only blue signals from the column 180, green signals from column 182, and red signals from column 184.

FIG. 5K is a bright field reflectance image showing the positions of all three populations of nanowires functionalized with P1, P2 and P3 probe PNA aligned in Gap 1, Gap 2 and Gap 3, (186, 188, and 190) respectively following integration with evaporated Ti (~300 nm). FIG. 5L is an overlaid fluorescence image showing that the fluorescently labeled targets T1, T3 and T2 hybridized selectively to the nanowires following integration procedures with P1, P2 and P3 aligned in Gap 1 (Alexa 488), Gap 2 (TAMRA) and Gap 3 (Alexa 647) respectively. Again, the original color image showed with only blue signals from the column 186, green signals from column 188, and red signals from column 190.

Sandwich Hybridization Assay

Figure 6A:
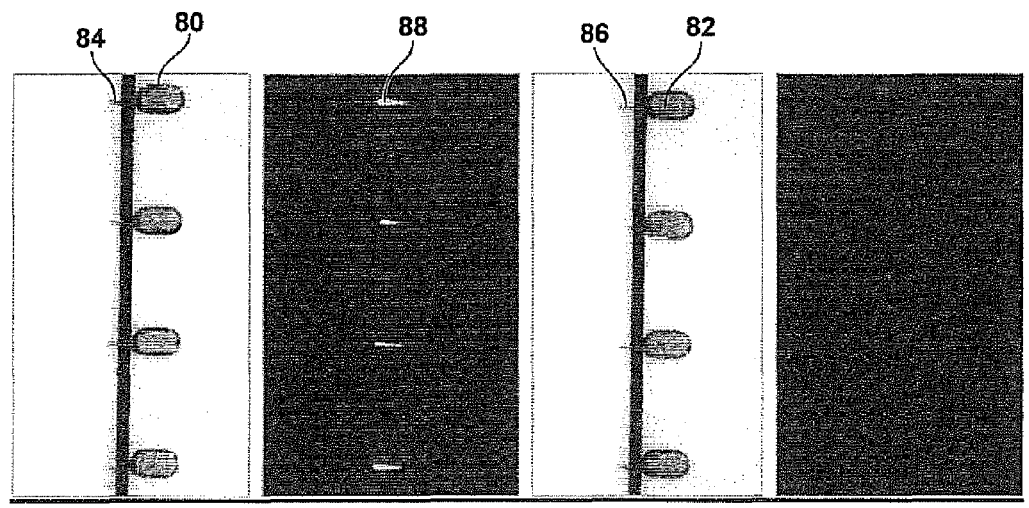
Figure 6A:
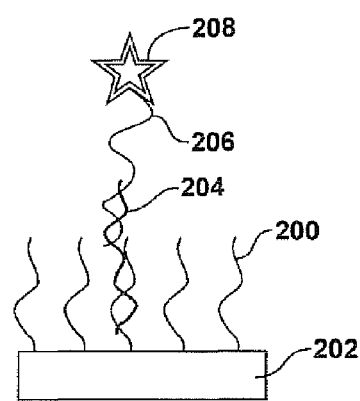

FIGS. 6A-6B illustrate the compatibility of the electric-field assisted assembly method to a sandwich hybridization assay. FIG. 6A shows the probe DNA strands 200 are attached to a nanowire 202, the target strand 204 binds to it via selective hybridization, after which the, fluorescent tag 208 on the secondary probe strand 206 completes the sandwich and reports the presence of the target strand via fluorescence emission.

FIG. 6A shows a bright-field reflected image with blue illumination, and FIG. 6B shows a fluorescence image of the same location. Au/Ag striped ("barcoded") nanowires were coated with a silica shell, then a probe sequence of DNA. The functionalized nanowires are visible in FIG. 6B, e.g. at 210 between electrodes 212 and 214.

Different DNA sequences were used on each of the different nanowire patterns. A target DNA sequence was then added, followed by rinsing and exposure to a fluorescent secondary probe DNA strand. If the correct target sequence was present, a sandwich hybridization assay would lead to fluorescence on the wires that carried the appropriate probe sequence. In this case, only 6 of the wires pictured in FIGS. 6B-6C have the correct DNA sequence, e.g. 212 in FIG. 6C, these are the wires with a single Ag segment at one end of otherwise Au wires (Ag sections appear brighter than Au under blue illumination).

These data show that a hybridization assay can be performed prior to electrofluidic assembly of DNA-coated nanowires across guiding electrodes. In this case the electrodes were indium-doped tin oxide on silica glass (to facilitate imaging). Alignment was performed out of ethanol. Pre-hybridized DNA oligonucleotides remained on the wires carrying their complementary DNA even after assembly. Note that the three patterns of wires, each with a different DNA sequence, were mixed before assembly in this experiment.

Nanowire Sensors Integrated with Silicon MOS Circuit

Figure 7C:
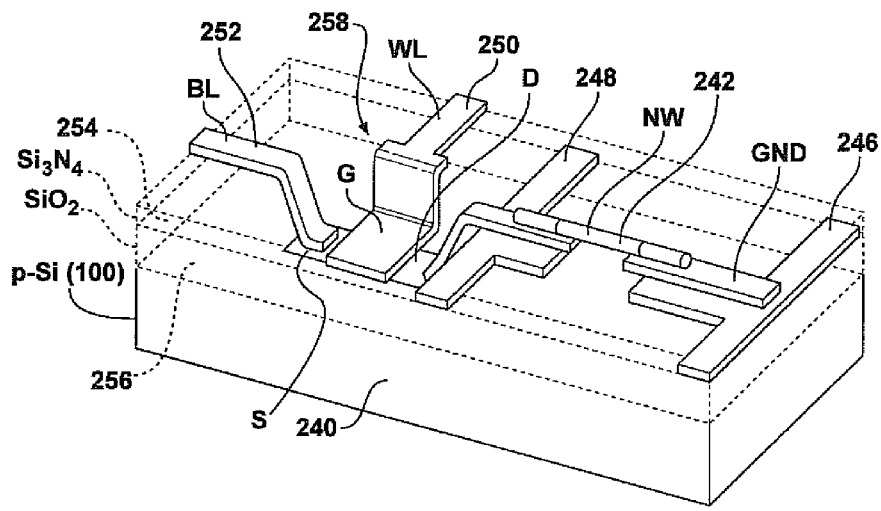

FIGS. 7A-7C show a schematic of an example multiplexed cross-point nanosensor array and back end process flow for nanowire sensor integration on a functional Si MOS chip containing Si access transistors.

FIG. 7A shows a schematic of multiplexed readout circuitry, with one circuit element 220 shown in more detail in FIG. 7B. Each circuit element includes a chemoresistive nanowire, shown schematically at 224. A Si MOS-based multiplexer and access transistors such as 226 can be used to address individual nanosensors in a high-density cross-point array 222. This approach improves S/N ratio and detection limits due to large redundancy, and consumes less power than conventional thin film sensors. Multiplexed addressing reduces chip area consumed by readout.

FIG. 7C shows a possible implementation on the surface of a chip, showing the word line (WL) connected to the gate of a FET, the bit line (BL) connected to the source, and a chemoresistive nanowire between the drain and the ground terminal.

The figure shows a nanowire element 242, connected between an access transistor 258 and ground (GND) 246. The transistor has source (S) connection 252 connected to the bit line (BL) 252, ground (G) connection 250 connected to the word line (LW), and drain (D) connection 248 connected to the nanowire. The substrate includes p-Si (100) 240, with a silicon oxide layer 256 and a silicon nitride layer 254.

In other examples, a circuit element may comprise a chemoresistive FET. For example, the bit line can be connected to the source of a chemoresistive FET, the word line to the gate, and the drain being grounded.

Conducting polymer nanowires have charge carrier concentration (n or p) and resistance changes that may be analyte sensitive due to charge exchange and/or conformational chance of the polymer backbone during interaction with an analyte. Template-based electropolymerization of conducting polymer nanowires and nanotubes is possible. A high surface-to-volume ratio and a diverse set of conducting polymers and dopants allow control of a chemoresistive response. In other examples, polyethylenedioxythiophene (PEDOT) nanowires with $ClO_4$ and PSS dopants were prepared.

Integration is possible onto substrates comprising silicon MOS (including CMOS) chips. The guiding assembly electrode design must consider the more complex electric field intensity distribution present due to crossing metal interconnects, such as the word and bit lines, but nanowires can be positioned in arrays with high yield. Hence, an integrated sensor comprises nanostructures disposed on an integrated circuit substrate.

FIG. 7D-7J illustrate an example back end process flow used to electrically and mechanically connect assembled individual nanowires to a functional silicon MOS access transistor. FIGS. 7D-7F show fabrication of a MOS access transistor at 258, comprising a pair of n doped regions. FIG. 7D shows silicon substrate layer 240 and field oxide (FOX) layer 256. FIG. 7E shows patterning. FIG. 7F shows silicon nitride layer 254 and metal layers such as 252 (BL in FIG. 7C). FIG. 7O shows coating and microwell patterning of sacrificial dielectric 260 (a polymethylglutarimide (PMGI) resist) used for nanowire assembly, the nanowire 242 being assembled within a well 261 in the resist layer 262. FIG. 7H shows post assembly metal contact patterning and electroplating of gold metal 262. The electroplated gold contacts such as 264 provide electrical and mechanical connections between each individual nanowire and a specific access transistor on the chip or ground. FIG. 7H and FIG. 7I show lithographic patterning and selective removal of the guiding assembly electrodes that interconnect all of the nanowire devices, using layers 266 and 268. This produces a multiplexed cross point array of individually addressable nanowire sensors, for example such as shown in FIG. 7A.

The upper level metal interconnects can also be used as guiding electrodes during the assembly process. On chip electronic circuits may be used to supply the programmed sinusoidal alternating voltage for nanowire assembly.

Figure 8E:
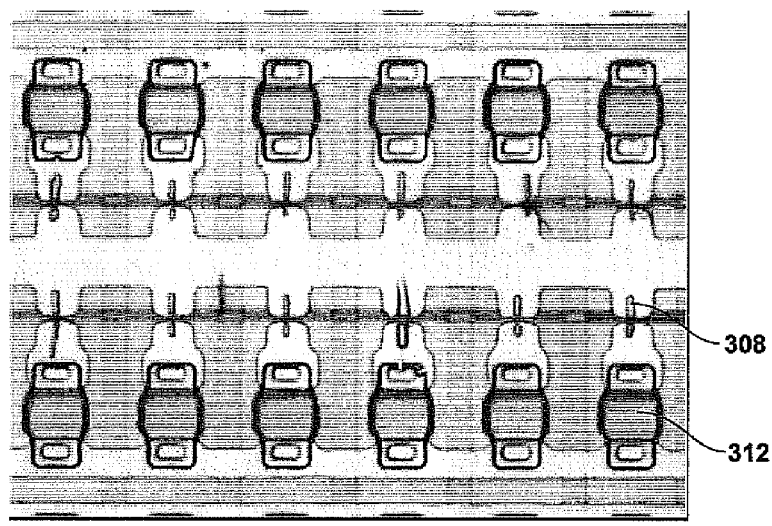
FIGS. 8A-8E show a 16×32 multiplexed nanowire sensor array.
Figure 8A:
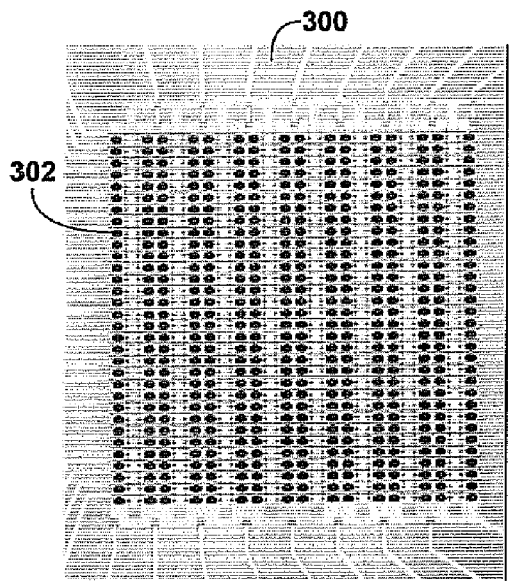
Figure 8B:
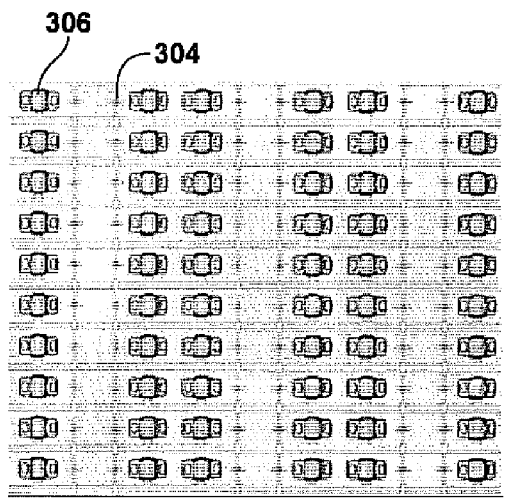
Figure 8C:
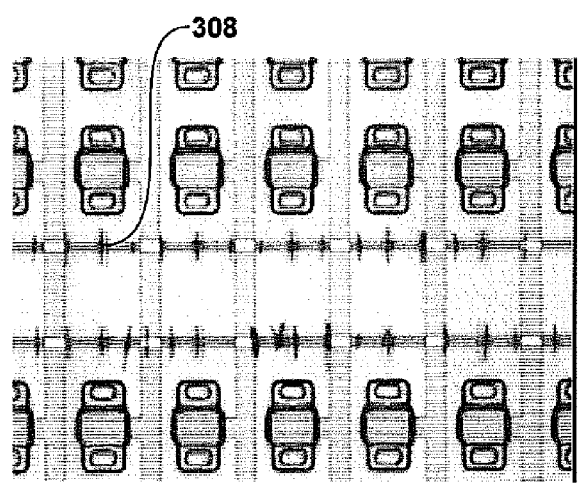
Figure 8D:
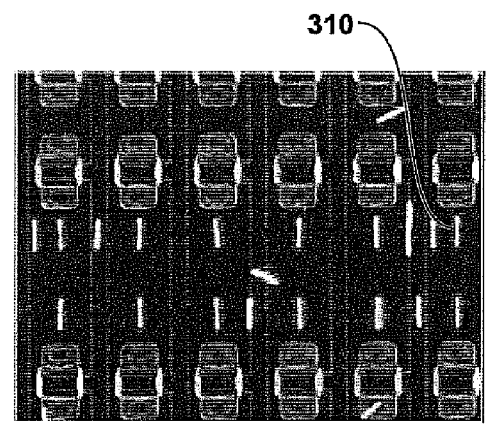

FIGS. 8A-8C show a 16×32 multiplexed nanowire sensor array 300 formed by a process such as that shown in FIGS. 7A-7J. FIG. 8A shows optical microscope images of a functional silicon MOS access transistor array 302. The transistor array is coated with a sacrificial photoresist layer patterned with microwells 304 registered relative to access transistors 306 on the silicon substrate. The microwells are 1 µm wide and 5 µm long.

FIG. 8C shows an optical microscope image following preferential assembly of individual conducting polymer (PEDOT) nanowires 308 in each microwell. FIG. 5D shows preferential assembly of individual Rh nanowires 310 in each microwell. Individual nanowire directed assembly yields exceeding 90% were obtained.

FIG. 8E shows an optical microscope image following the back end process de-scribed in FIGS. 7D-7J. This electrically connects each individual PEDOT nanowire 308 to a single access transistor 312 on the silicon substrate, and allows individually addressable, multiplexed readout of the response of each chemoresistive sensor device in the array.

In other applications, heterogeneous nanosensor integration is possible, using nanowires having different functionalization. For example, large numbers of different populations of nanosensors can be prepared off-chip and assembled on-chip. Pattern recognition may be used to discriminate a target analyte from response of diverse set of sensor elements, or selective chemistry interactions may be used to discriminate the target analyte. Even though many examples above refer to nanowires, the invention is not limited to nanowires. Similar approaches may be used to prepare devices including nanostructures, microstructures, and the like.

Electric-Field Assisted Directed Assembly of Nanowires

The effects of electric-field forces in an example nanowire assembly process are now further discussed. Long-range dielectrophoretic forces on the nanowires can be induced by applying an alternating voltage to buried electrodes to attract and orient the nanowires. Short-range forces determine the final alignment of nanowires on chip. Short-range forces may be considered those acting when a nanostructure is close to the substrate, or proximate to a predetermined position, so as to optimize position and/or orientation.

Figure 9A:
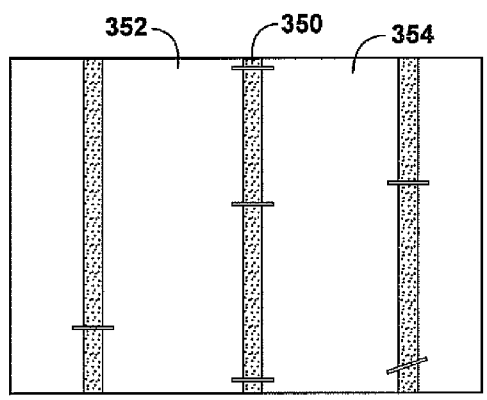
FIGS. 9A-9D show self-arrangement of nanowires on a substrate having parallel interdigitated array of assembly electrodes.
Figure 9B:
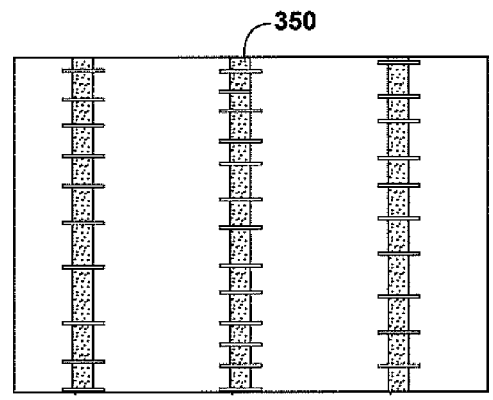
Figure 9C:
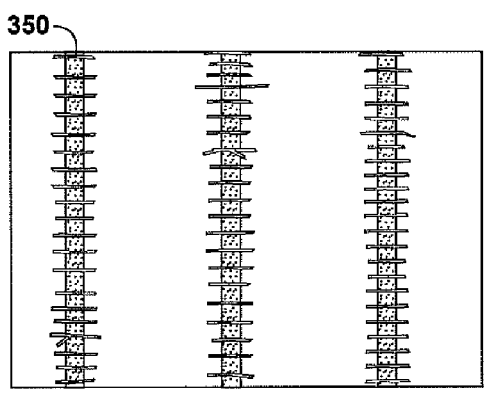
Figure 9D:
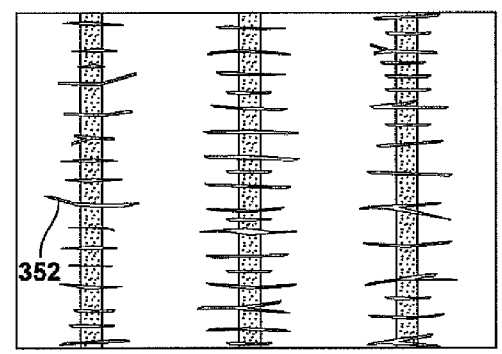

FIGS. 9A-9D show self-arrangement of nanowires on a substrate having parallel interdigitated array of assembly electrodes covered with a sacrificial photoresist layer. Each image is approximately 50 microns across. The nanowires 350 bridge a gap between parallel electrodes (e.g. 352 and 354), and there is no surface topography in this example to induce further localization. FIG. 9A shows a relatively small number of nanowires, randomly arranged as a function of position along the electrodes. FIG. 9B shows a greater density of nanowires 350. FIG. 9C shows that at a certain density of deposited nanowires, self-arrangement of the nanowires occurs. This can be combined with the process described in relation to FIGS. 5A-5L. The spacing between the nanowires is non-random. FIG. 9D shows that for greater surface densities, nanowires may form end-to-end chains such as 352. This limits the minimum spacing that can be achieved between adjacent nanowires.

Figures 10A, 10B, 10C:
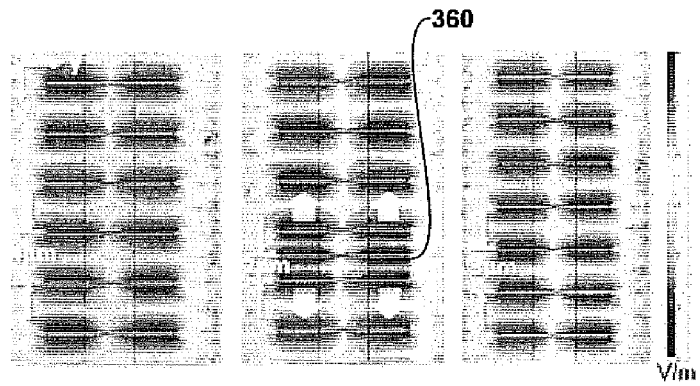
FIGS. 10A-10I and FIGS. 11A-11C further illustrate field distributions and effects.

FIGS. 10A-10I further illustrate field distributions. FIGS. 10A-10C shows a three dimensional simulation of the electric field profile, as $\log_{10}E_y$, at the surface of a sacrificial dielectric that is not patterned with microwells following the experimental results shown in FIG. 9A-FIG. 9D. FIG. 10A shows the electric field profile with a uniform nanowire spacing of 4 μm. FIG. 10B shows an additional nanowire 360 captured between an adjacent pair of nanowires spaced 4 μm apart. FIG. 10C shows nanowires reorganize until uniform spacing is achieved.

Figure 10D:
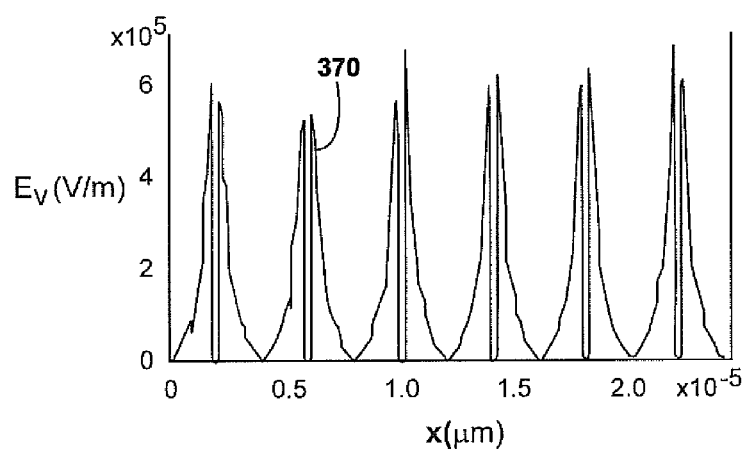
Figure 10E:
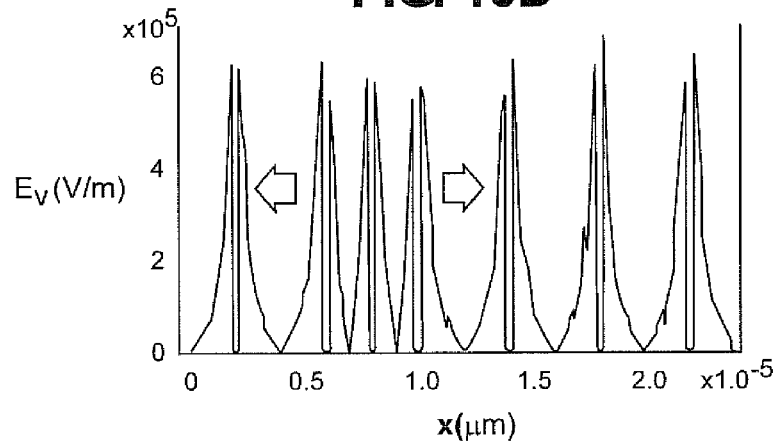

FIGS. 10D and 10E shows a line scan of $E_y$ measured near the tip of the assembled nanowires. FIG. 10D shows the spatially-dependent electric field 370 for uniformly spaced nanowires. The electric field is symmetric about each nanowire. This gives an electric potential profile that peaks midway between each nanowire, and has equal peak magnitude independent of position on the electrode. FIG. 10E shows the spatially-dependent electric field for nonuniformly spaced nanowires. The electric field is asymmetric about the closely spaced nanowires. This gives an peak electric potential that is lower near the closely spaced nanowires. Dynamic rearrangements may then achieve a uniform electric field profile, and hence substantially uniform pitch when nanowire density increased.

Figures 10F, 10G:
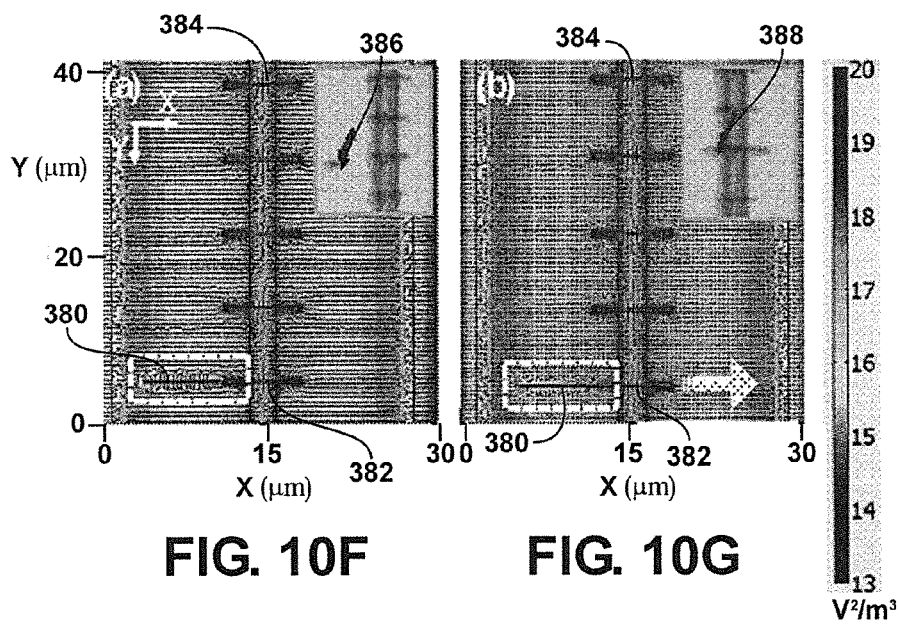
Figures 10H, 10I:
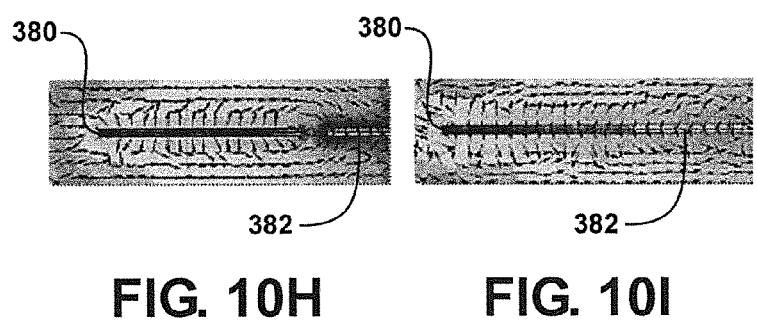

FIGS. 10F-10I show formation of nanowire chains through mutual dielectrophoresis. The electric field intensity is very high at the tip of the nanowires, but the vertical extent of the field, and hence dielectrophoretic force, is limited. FIG. 10F and the detailed view FIG. 10H show that if a nanowire 380 comes into close proximity to the tip of nanowire 382, located across electrode gap 384, with the localized electric field, another nanowire assembles end-to-end. FIGS. 10G and 10I show the nanowire 380 chained to the nanowire 382. The inset views 386 and 388 show microscopy images of a scenario similar to the modeled views. The same transition from random spacing to uniform spacing to chaining occurs when nanowires are assembled on a sacrificial dielectric that is patterned with microwells. This determines the minimum spacing between adjacent nanowires, which depends on the electrode design, nanowire length, and conductivity.

Figure 11A:
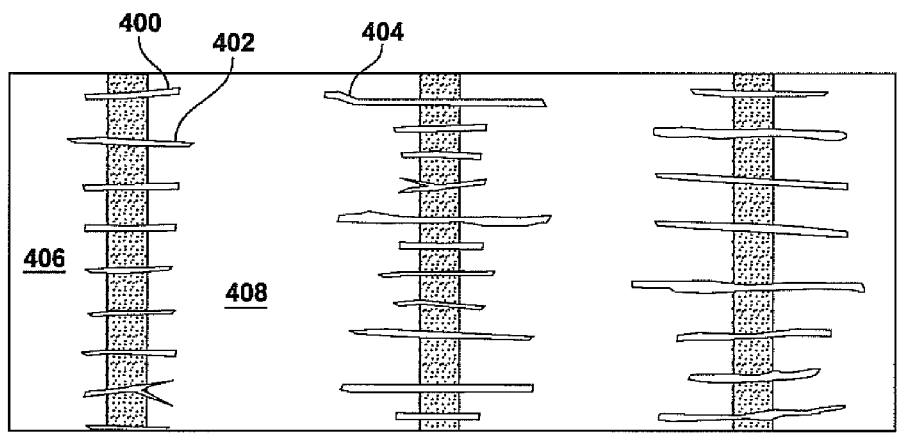
Figure 11B:
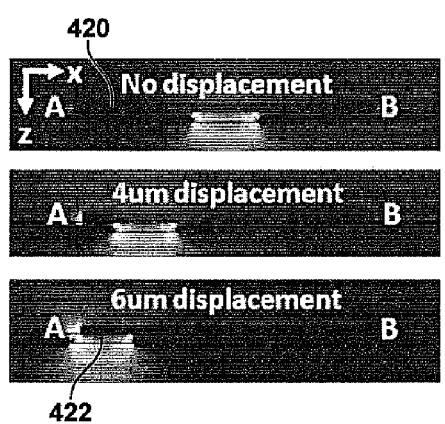
Figure 11C:
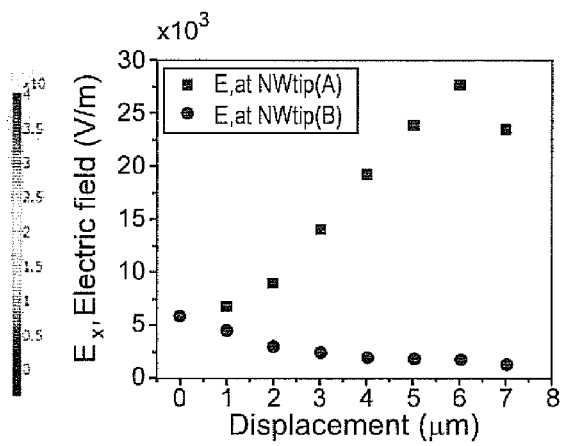

FIGS. 11A-11C further illustrate field distributions. FIG. 11A shows an optical microscope of electric-field assisted assembly of a mixed suspension containing nanowires having three different lengths (e.g. 400, 402, and 404) at the surface of a dielectric substrate with spaced apart electrodes (e.g. 406 and 408) on a substrate that is not patterned with microwells.

FIG. 11B shows an electric field profile for a nanowire that is centered across the gap and with 4 and 6 μm displacement. The nanowire is shown centralized in the images, with the electrode gap 422 being relatively displaced laterally.

FIG. 11C shows that the electrical restoring force increases as the displacement from being perfectly centered increases. These short range capacitive forces between the nanowires and the underlying metal electrode cause the nanowires to center themselves across the gap independent of length. This results in end-to-end registration of nanowires having the same length.

However, other methods may be used to obtain positional registration, such as topography, surface characteristic modulation, electric field distributions, radiation fields (electromagnetic or acoustic, such as standing waves), magnetic field distribution, and the like.

In further examples, post-process nanowire integration at predefined locations on-chip is possible. Sharp electrode tips enhance electric field strength in gap, allowing preferential nanowire assembly in both lateral and vertical directions. High defect densities over large chip area may occur.

Spatial topography, such as the provision of photoresist wells, may be used in combination with electric field effects to assist positioning of nanostructures. Nanowires assemble preferentially in photoresist wells, but a significant number may be 'misaligned' relative to the photoresist wells.

Any misaligned nanowires can be 'lifted-off' when photoresist is dissolved. An 80+% single NW integration yield using lab-scale NW delivery was achieved, with defects including missing, chained, and multiple NWs (as-grown).

Hence, electric fields applied between electrodes on a substrate may be used to provide electric fields that attract and align nanostructures. For example, nanowires may be aligned along a direction parallel to field lines. Other anisotropic shapes, such anisotropic nanostructures such as discs, tubes, and the like, may also be aligned by electrical fields. Nanostructures may have electrical anisotropy, which may be correlated with spatial anisotropy. However, electrical anisotropy can be introduced independent of spatial anisotropy, for example using charged or dipolar elements (using, for example, chemical groups, spatially selective functionalization, or other approach).

Structure Assembly.

Examples described herein sometimes refer specifically to nanowires. However, the present invention is not limited to nanowires. The invention may also relate to other nanostructures, microstructures, or positioning of any prefabricated element on a substrate. Nanostructures may comprise geometric shapes such as rods, tubes, fiber bundles, irregular forms, dendrites, and the like. A nanostructure may include one or more quantum scale structures, such as quantum dots, possibly in an elongated overall structure. Nanostructures may include semiconductor junctions, quantum wells, resistive elements, capacitive elements, radiation sensitive elements of any form, chemoresistive or bioresistive elements, some combination of elements, and the like.

Nanostructures, such as nanowires, may be conducting, semiconducting, slightly conducting, or electrically polarizable so as to be aligned by an electric field. The technique works for various nanostructure materials, including metals, semi-metals, semiconductors (inorganic, polymer, and the like), ferroelectrics, and the like. Nanostructures may comprise segments of different compositions and/or topography. For example, nanowires may comprise metal/semiconductor/metal segments, segments of different semiconductor doping, magnetic segments, metal segments, or other configurations.

Nanostructure complexity is not limited by the constraints of trying to process the nanowires on-chip. Nanostructures may be prepared having various components, such as nanowires having a plurality of different compositional (and/or doped) segments.

Figure 12A:
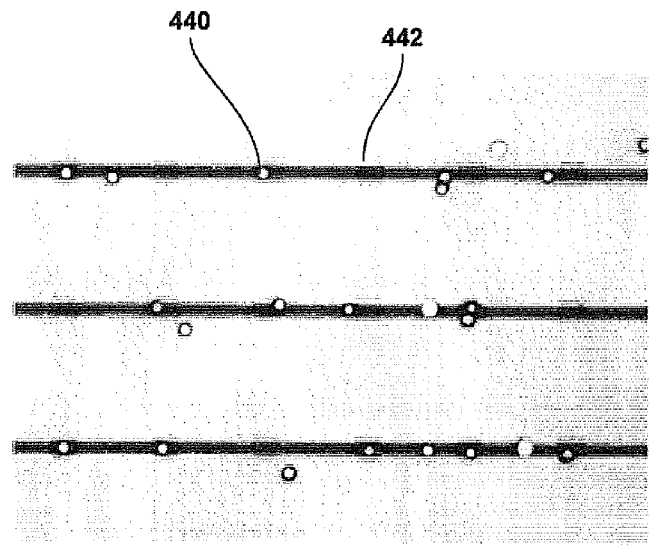
FIGS. 12A-12B show examples of other structure materials, including gold disks and graphene.
Figure 12B:
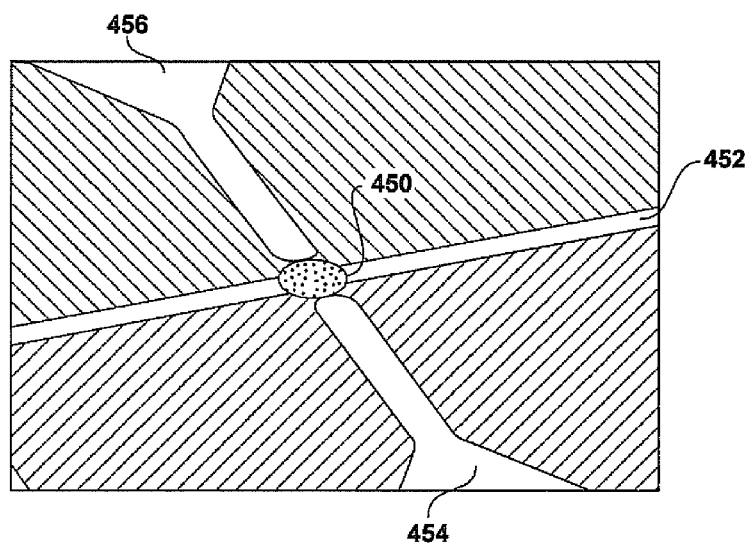

FIGS. 12A-12B show examples of other structure materials and geometries that have been assembled using the general method described here. FIG. 12A shows preferential assembly of 20 nm thick, 1 μm diameter Au disks 440 into circular microwells 442 patterned in a sacrificial photoresist layer.

FIG. 12B shows directed assembly of a single graphene sheet. The sheet 450 was assembled on top of a lithographically patterned metal back gate electrode 452. The width of the back gate electrode is 1.5 μm. It is electrically contacted by source and drain electrodes, shown on the top and bottom at 456 and 454. Examples of the present invention can be used to fabricate arrays of graphene transistors on a substrate.

Examples of the present invention include methods of microstructure assembly on top of metal patterns such as back gates. Conventionally, it is very difficult to integrate metal underneath devices when integrating materials using epitaxial growth. Examples include graphene gapping by back gating, or other approaches to assembling non-metallic nanostructures over an electrode gap.

Cantilevered Nanowire Resonator Devices

Example resonators were fabricated using two types of nanowires—semiconducting silicon (Si) or metallic rhodium (Rh)—synthesized off-chip using different growth methods. The silicon nanowires grown by the Au-catalyzed vapor-liquid-solid (VLS) technique are predominately single crystal and oriented in the <111> or <112> growth directions. In contrast, Rh nanowires electrodeposited within the pores of anodic aluminum oxide membranes are polycrystalline with an average grain size of 5 nm.

Anodic aluminum oxide (AAO) membranes (Anodisc25, Whatman Scientific) were used as templates for nanowire synthesis. Silicon nanowires were grown by VLS using Au catalyst nanoparticles electrodeposited within the pores of the membrane using previously reported methods. The growth was carried out in a hot-wall furnace using a mixture of $SiH_4$ in $H_2$ at 500° C., with a total pressure of 13 Torr and $SiH_4$ partial pressure of 0.65 Torr. The silicon nanowire growth rate was ~1 μm/minute. The portions of the silicon nanowires that grew outside the membrane were released into isopropyl alcohol (IPA) by sonication. The Rh nanowires were grown by galvanostatic electrodeposition of Rh from Rhodium S-Less plating solution (Technic, Inc.) using a Ag working electrode and Pt counter-electrode. The Rh nanowire growth rate at a constant current of 1.65 mA was 0.8 μm/hr. Ag was removed from the membrane using 7.5M $HNO_3$, and the nanowires released into IPA by dissolving the membrane in 3.0 M NaOH.

However, assembly methods according to embodiments of the present invention are quite general and can be extended to other nanowires or other nanostructured materials, and nanostructure geometries.

Figures 13A, 13B:
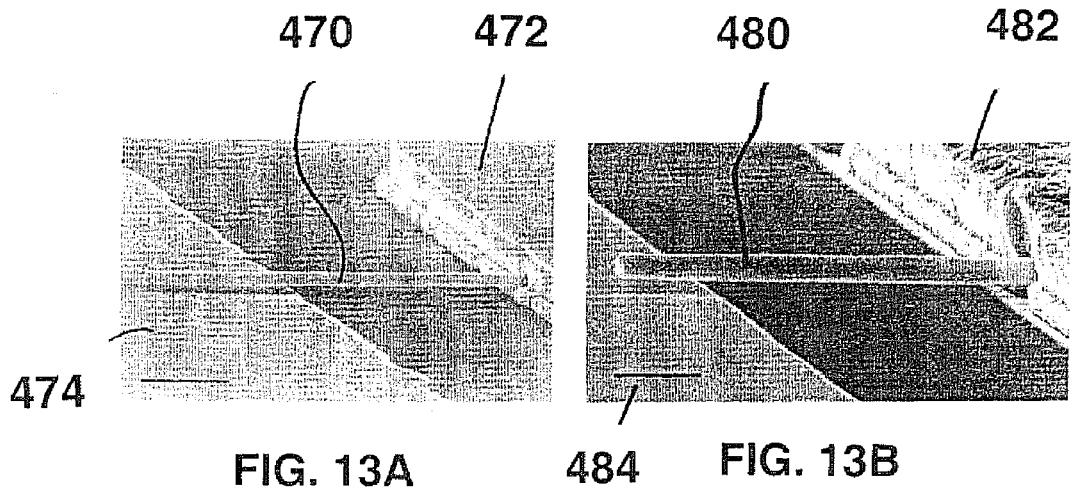
FIGS. 13A-13B show an example of cantilevered silicon and metallic Rh nanowire resonator devices.

FIGS. 13A-13B show an example of cantilevered silicon and metallic Rh nanowire resonator devices fabricated using the method described in FIGS. 1A-1F. FIG. 13A shows field emission scanning electron microscope images of a cantilevered silicon resonator 470 clamped with electrodeposited Au 472 and suspended 300 nm above the Au electrode 474. FIG. 13B shows a cantilevered Rh nanowire resonator 480 clamped with electrodeposited Au 482 and suspended above the Au electrode 484. The scale bars are both 1 μm.

These examples show that an electrode used for nanostructure alignment can also be used as an electrode used to electrically drive the resonators. The electrodeposited metal fully surrounds each nanowire to form a clamp with nearly vertical sidewalls that secures the nanowire to the Si chip. This differs significantly from previous nanowire and nanotube-based NEMS that use thin evaporated top metal as a mechanical anchor and are released by selective wet etching of an underlying $SiO_2$ layer. For such devices, the clamp can be expected to lower Q-factor and mechanical stiffness, as in top-down NEMS. Further, these figures show that the cantilevered nanowires are straight and parallel to the chip surface, including Rh nanowires (see FIG. 13B). Thus, deformation observed in NEMS fabricated using sputtered or evaporated metal thin films due to stress evolution during the cantilever release process is eliminated using nanowires synthesized off-chip.

Resonance Characterization

The resonant oscillation of cantilevered Si and Rh nanowires was driven and measured using a spectrum analyzer (Agilent E4402B) equipped with a tracking generator. Chips containing nanowire cantilever arrays were mounted on a piezoceramic actuator disk (extracted from a Radio Shack 273-059 buzzer). Nanowires were vibrated either using the piezo disk or by an electrical signal applied between the metal clamp and electrode below the suspended tip. The driving voltage was provided by the tracking generator of the spectrum analyzer. The chips were mounted in a vacuum chamber with absolute pressure controlled from $5 \times 10^{-10}$ atm to 1 atm by pumping out or introducing dry nitrogen. A laser interferometry technique was used to translate the displacement of individual nanowire resonators into an optical signal, which was monitored using an AC-coupled photodetector (New Focus 1601-FS-AC). Resonant amplitude information was extracted from the photodetector signal using the spectrum analyzer and averaging over 100 continuous sweeps in 25 seconds for one spectrum.

Resonator performance was investigated by measuring the resonant oscillations of Si and Rh nanowire cantilevers at high vacuum ($5 \times 10^{-10}$ atm). Cantilevered rather than doubly-clamped nanowire resonators were used to eliminate uncertainty in measured elastic properties from beam-tension effects. The nanowires were harmonically forced using either piezo or electrical drive methods, and their motion sensed using laser interferometry.

Figures 13C, 13D:
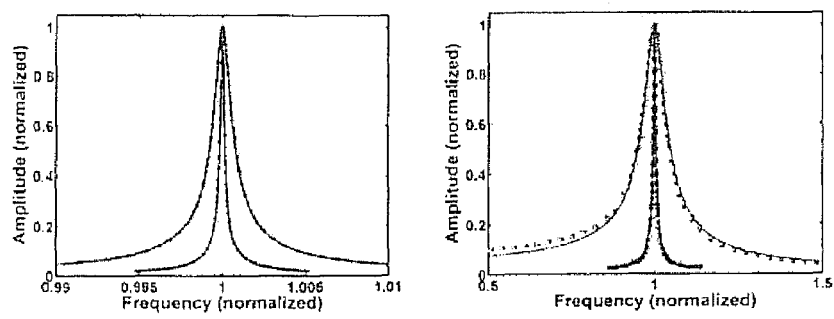
FIG. 13C-13F show resonant responses.

FIGS. 13C and 13D show resonant responses at room-temperature and high vacuum (13C) and at atmospheric pressure (13D) using an electrical drive. FIG. 13C shows normalized measured spectra (circles) and Lorentzian fit (line) for Si (inner curve) and Rh nanowire (outer curve) resonators at high vacuum. Filled and open circles correspond to increasing and decreasing frequency sweeps. For Si and Rh nanowires, respectively: Q-factors are 4830 and 1080; resonance frequencies are 1.928 and 7.186 MHz, diameters are 330 and 280 nm, and suspended lengths are 11.8 and 5.8 μm. FIG. 13D shows normalized resonant spectra for Si (outer curve) and Rh nanowire (inner curve) at 1 atm. Forward and reverse sweeps are coincident with Q-factors of 210 and 18 for Rh and Si nanowire resonators.

Figures 13E, 13F:
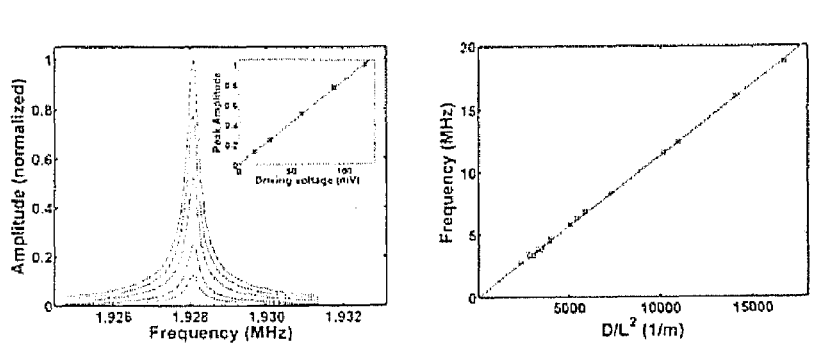

FIG. 13E shows spectra of the Si nanowire resonator in FIG. 13A. The resonant peak frequency is constant over a decade of driving voltage, with the inset showing that peak amplitude varies linearly over nearly a decade of driving voltage. This confirms that the resonators operate in the linear regime. The linear response and high-Q values make resonators such as these suitable for sensitive resonance-based detectors.

FIG. 13F shows scaling of silicon nanowire resonance frequency with geometry. The low scatter and high Q-values are together indicative of uniform, low-loss clamping.

In other examples, both ends of a nanowire may be attached to the substrate to make fixed-fixed resonators, as compared to the fixed-free resonators illustrated.

Figure 14A:
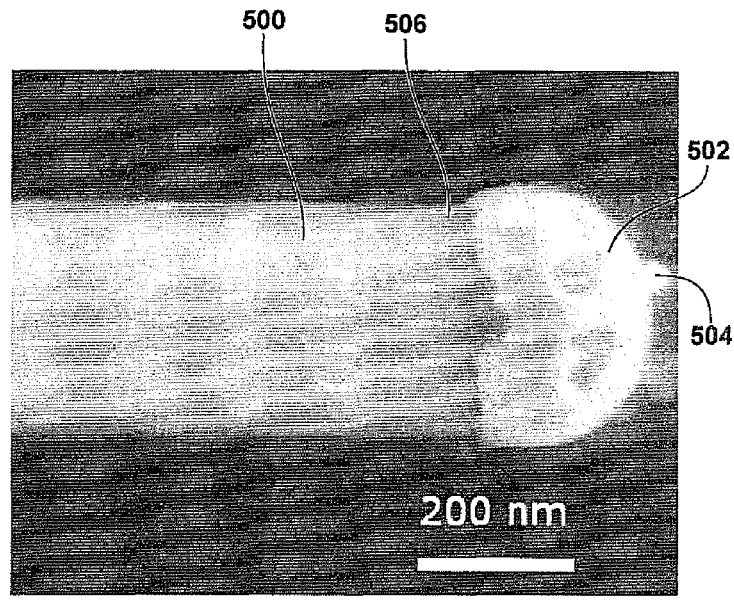
FIGS. 14A-14B shows a cantilevered silicon nanowire resonator being used as a mass sensitive detector.
Figure 14B:
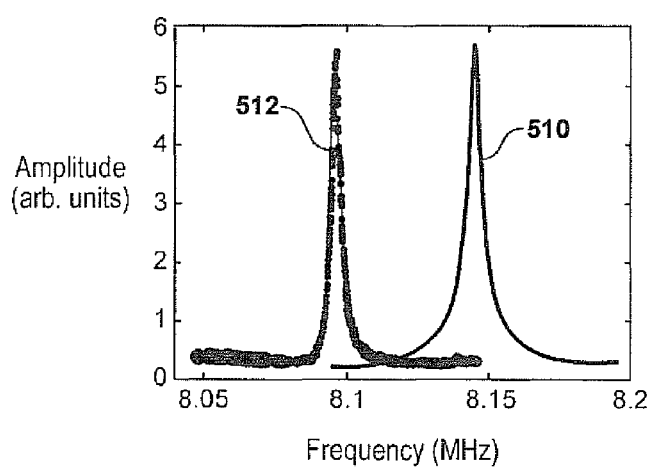

FIGS. 14A-14B show a cantilevered silicon nanowire resonator being used as a mass sensitive detector. FIG. 14A shows a field emission scanning electron microscope image of the suspended portion of the silicon nanowire resonator 500, which has a Au catalyst particle 502 at the nanowire tip, following selective capture of two 20 nm diameter Au nanoparticles (504 and 506) on the Au tip.

FIG. 14B shows the measured resonance frequency shifts to the left by 50 kHz (from curve to 510 to curve 512) following nanoparticle capture, which matches expected value for added mass of two 50-nm Au particles (2.6 fg) on the nanowire tip.

Chemical Sensor Nanowire Devices

Figure 15A:
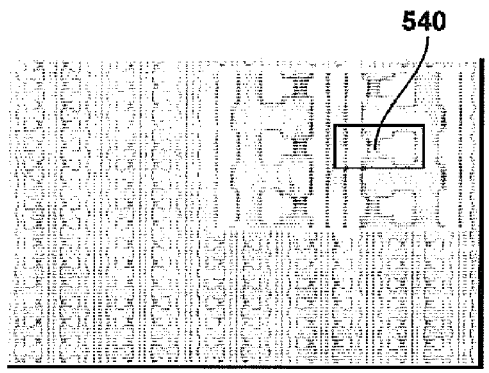
FIGS. 15A-15D show example conductive polymer nanowire device arrays.

FIGS. 15A-15D show example of conductive polymer nanowire device arrays integrated using the method described in FIG. 8. FIG. 15A shows a low magnification optical microscope image of a polyethylenedioxythiophene (PEDOT)

chemical sensor cross-point device array integrated with silicon MOS access transistors. An inset shows the approximate location of a sensor element at 540.

Figure 15B:
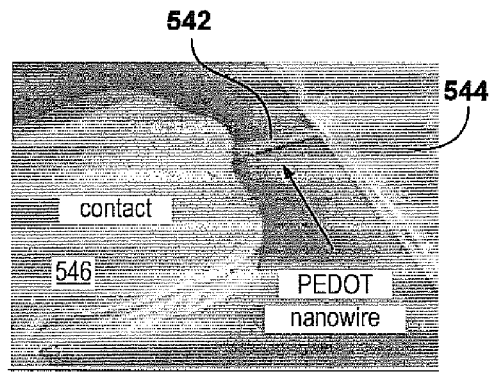

FIG. 15B shows a field emission scanning electron microscope image of a single element in the array; the element is comprised of a single PEDOT nanowire 542 that is contacted by electrodeposited Au metal 544 and 546. The left contact 546 connects the PEDOT nanowire to the source and/or drain region of the MOS access transistor, while the right contact 544 connects the PEDOT nanowire to the common circuit ground.

Figure 15C:
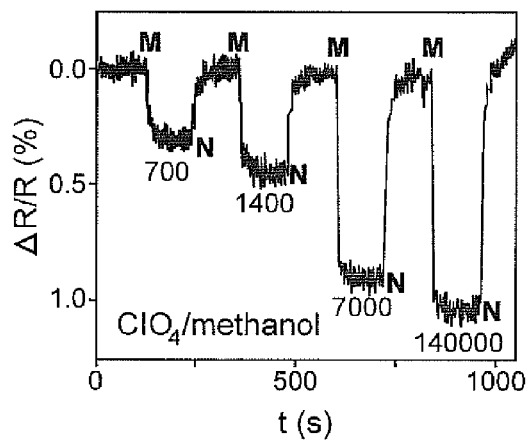
Figure 15D:
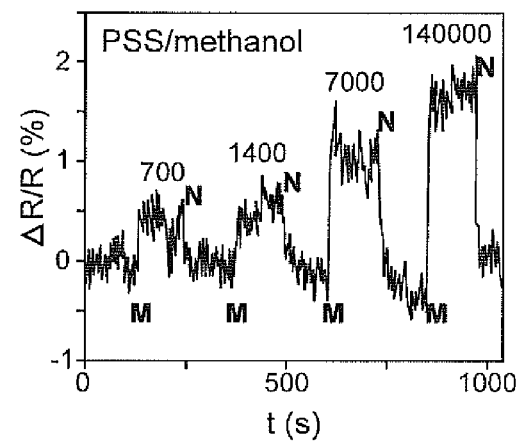

FIGS. 15C-D shows the response of PEDOT nanowires doped with ClO4 (15C) and PSS (15D) to varying concentrations of a volatile organic compound, methanol. The PEDOT-ClO4 was sensitive to 100 ppm of methanol, which is comparable to the best thin film sensors fabricated using PEDOT conducting polymers. The different temporal responses to different chemical species can also be used for analyte identification.

In other applications, heterogeneous nanosensor integration is possible, using NWs having different functionalization. For example, large quantities of different types of nanosensors can be prepared off-chip and assembled on-chip. Pattern recognition may be used to discriminate a target analyte from response of diverse set of sensor elements. Even though many examples above refer to nanowires, the invention is not limited to nanowires. Similar approaches may be used to prepare devices including nanostructures, microstructures, and the like.

Semiconductor Field Effect Transistors

FIGS. 16A-16B provide an example of a wrap-around-gate silicon nanowire field effect transistor assembled and integrated using the method described here.

FIG. 16A shows a schematic of a wrap-around-gate silicon nanowire MOSFET. The figure shows a nanowire 614 with source electrodes 604 and 606, top gate electrode 608, drain electrodes 609 and 610, and local back gate 612. The substrate comprises doped silicon 600, a global back gate 602, and a silicon nitride layer 616. A silicon dioxide ($SiO_2$) shell 618 was grown by dry thermal oxidation of the SiNWs prior to on-wafer integration and served as the gate dielectric of the SiNW MOSFET.

FIG. 16B shows a field emission scanning electron microscope image of an n-channel silicon nanowire transistor. The nanowire is shown as the thread-like structure at 614

Figure 16C:
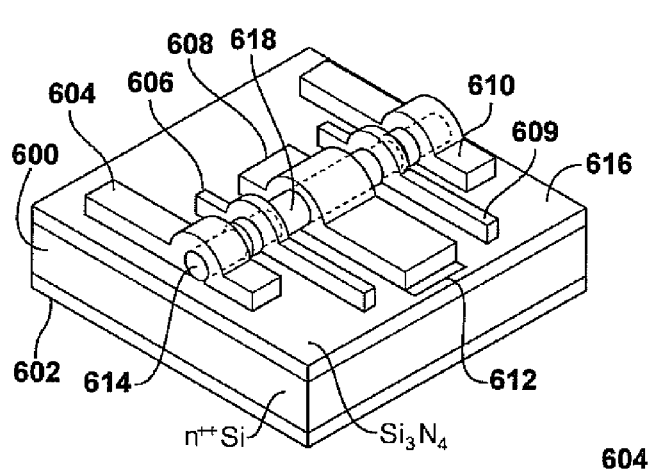
Figure 16C:
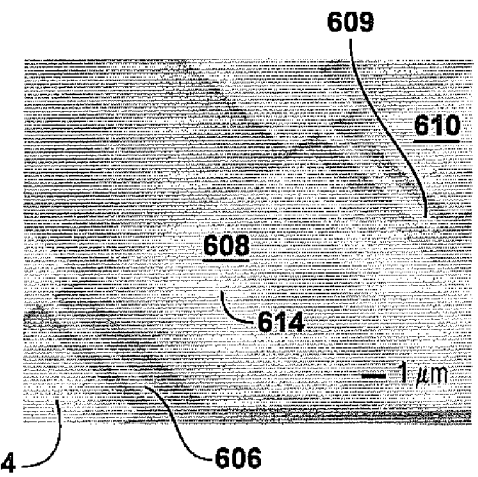
Figure 16C:
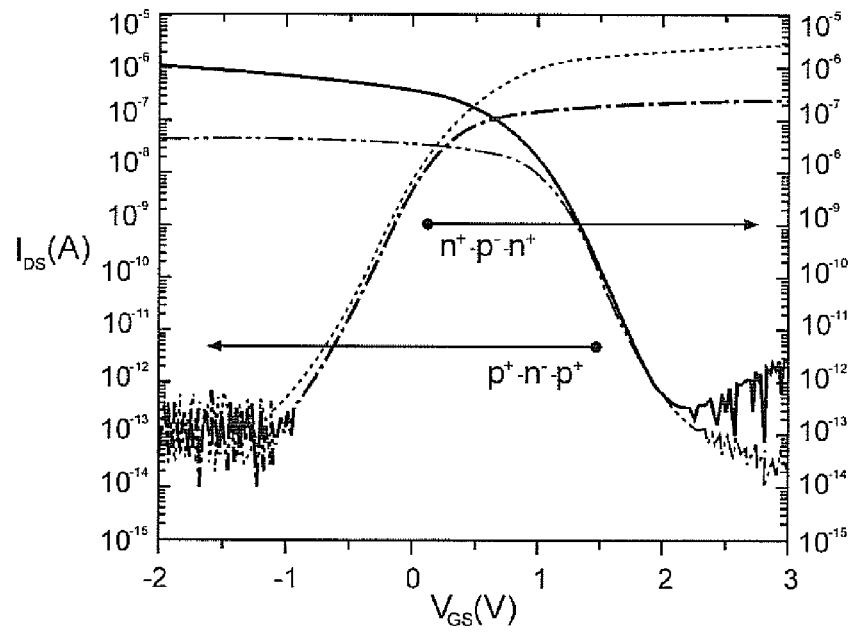

FIG. 16C shows the measured transfer characteristics of n-channel and p-channel silicon nanowire MOSFETs.

Devices were also fabricated without a top gate for biosensing applications.

Other Aspects

In some examples of the present invention, electric fields are combined with positional registration so as to position nanostructures at predetermined locations. Positional registration may be obtained using topography (such as wells within a photoresist layer, ridges, and the like), electric field variations (for example, using shaped electrodes such as sharp tips along an elongated electrode to positionally modulate a local field), or spatial modulation of other parameters such as surface energy, magnetic field, or other parameter. Similar methods can be used with other nano/microstructures.

In representative examples, patterned wells within a photoresist layer, deposited over electrodes with an intervening dielectric layer, gave excellent positional registration. The electric field acts so as to align nanowires along the direction of elongation of the well, and further provides an attractive force. In particular, electric field gradients near electrode edges may act to orientationally align and positionally center nanostructures between a spaced apart pair of electrodes. The use of short range electric forces so as to center nanowires may provide great advantages over conventional methods, as it allows large numbers of nanowires to be consistently positioned relative to the electrodes. For example, nanostructure centers may align along a substantially linear path (or other smooth path as desired) within an electrode gap.

Nanostructures may have some degree of surface mobility while deposition proceeds. Unlike capillary based registration methods, the nanostructures may remain in suspension while deposition proceeds, allowing dynamic rearrangement to occur and facilitating regular spacing. If wells are used, nanowires may move along the electrodes and fall into a well when one is encountered. An electric field may act so as to hold the nanowire within a well. Solvent removal may occur only after a desired positional registration is obtained.

A second patterned photoresist layer may be used to determine the location of contacts to the nanostructures, for example after removal of the solvent and disconnection of the electric field. For example, an opening in the second photoresist layer may be in registration with part of a patterned well, allowing metals or other materials to be deposited at one or both ends of a nanowire, or otherwise contact a nanostructure. Electrical contacts may be made using metal deposition, for example using evaporation, electroplating, or other approach. Any resist, or any sacrificial layer, may be used in place of a resist. Nanostructures may be held of the substrate by support structures, such as anchoring structures for resonators, or held flat to the substrate, for example in FET applications.

A lift-off process was successful in removing defects, such as nanostructures not located at desired predetermined positions. In representative examples, nanowires that did not fall into patterned wells were removed by removal of the photoresist layer using a solvent. Other approaches to removal of sacrificial layers, such as acid etching or other approaches, may be used.

An advantage of approaches according to the present invention is that nanostructures may be functionalized off-chip. Hence, a sensor or other device may be readily prepared using a plurality of different nanostructure types and functionalizations thereof.

On-chip functionalization may require conditions incompatible with other structures and/or functionalizations. However, by the previous preparation of functionalized nanostructures, the types and functionalization of nanostructures in not limited by consideration for the chip environment or other sensor elements present (for example, high temperatures and harsh chemicals can be used as the nanostructure preparation is off-chip). Hence, different nanostructure types, such as polymer, metal, metal oxide, semiconductor, ferroelectric, magnetic, and combinations thereof may be combined on-chip in various heterogeneous integrations as desired. Selective placement of sensor elements is achievable. In some cases, on-chip processing may be used if desired.

The substrate may comprise electrodes and associated electronic driving circuitry for providing programmable, spatial control of electric field distribution on the surface of the substrate, and hence of the dielectrophoretic force acting on the microstructures.

A spatially confined electric field induces long-range dielectrophoretic forces, and short-range capacitive forces that control the placement of structures at predefined locations on the substrate surface. Short range forces may center the structure across the electrode gap, pro-viding end-to-end alignment for structures having the same dimension.

Different populations of structures can be positioned in different regions of the chip with low mismatch defects without requiring microfluidic channels to separate them during assembly. This allows sequential injection or dispersal of each population across the entire substrate area. In some approaches, channels can be used for parallel and simultaneous assembly of different structures on the surface.

Structures can be delivered to the surface using one or more of various techniques, such as by injecting between a coverslip and substrate, ink jet delivery, other printing methods, or any method of exposing the substrate to the structures.

Examples of the present invention allow sub-micron registration accuracy to underlying circuit devices on the substrate surface. For example, the substrate may comprise a silicon chip, including circuit devices such as transistors. In some examples, the spatially confined field is largest in the photolithographically defined wells (or depressions), and thus the structures preferentially assemble into the wells.

Registration accuracy for assembly of nanostructures on substrate can be maintained over large substrate areas (e.g. greater than 1 mm square) without run out (misalignment) across the circuit, avoiding problems of other soft lithographic approaches. Registration accuracy can be sufficient to connect individual assembled nanostructures to a specific device (such as a transistor) on the substrate (such as a chip). High densities of nanostructures can be realized (e.g. >106 cm2). Electrodes can be integrated onto arbitrary substrates (such as a semiconductor, glass, plastic, ceramic, or other substrate material) and also can be included as a standard back-end metal level in a CMOS process flow.

The electrode design can be customized for a particular application or desired predetermined location of the nanostructures. The nanostructures can be deposited in a regular array, and in other examples can be used for sparsely populated devices.

Assembly methods described herein are compatible with many different materials, coatings, substrate geometries, and nanostructure geometries (e.g. wires, tubes, ribbons, sheets, or other form). Examples include metal sheets and wires (e.g. Au, Pt, and the like), conducting organic materials (such as conducting polymers, fullerenes, nanotubes, graphene, and the like).

High individual nanowire assembly yields can be obtained (in typical experiments, >90% yields were obtained). Defects which may occur include empty sites, aggregates, and chains. However, electronic techniques such as defect detection, redundancy, and other approaches can be used to minimize the effects of such defects.

One or more of various post-assembly device integration techniques can be used. These may include traditional photolithographic methods used to define mechanical and electrical connection with respect to the depressions. In some examples, metal is electroplated to connect nanowires in the wells to the substrate. Other methods can be used. The integration yield can be enhanced by a 'lift-off' process, or removing structures that assemble outside of the wells.

The design of the metal electrodes that connect the structures to the surface can be configured for a desired application, allowing fabrication of different types of devices and connections to integrated circuits (which may underlie or be adjacent to the nanostructures), or other circuits on the chip. Examples demonstrated included resonators, chemically sensitive resistors (chemoresistors) and field effect transistors.

Another possible advantage is that the chemical treatment and temperatures used in the back-end process can be compatible with assembly of chemically and biochemically functionalized nanostructures, other biomolecule probes, polymers, and organic molecules.

Some examples of the present invention include methods for assembling and integrating heterogeneous populations of prefabricated micro/nanoscale components, such as functionalized nanostructures. Assembly of different populations (species) of nanostructures in different regions on substrate can be achieved with submicron registration accuracy, allowing electrical connection to existing (previously fabricated) circuits or other substrate components.

Example approaches allow separation (in both time and space) of structure synthesis, functionalization thereof (e.g. coating), and assembly of the structures onto a substrate. This overcomes one or more problems typical of conventional methods, such as thermal budget, lattice and thermal expansion coefficient mismatch, chemical incompatibilities between the component materials and fully fabricated circuits.

Example devices include a monolithically integrated circuit that delivers diverse functionality with high density integration such as $\leq 10^6$ nanostructures per square centimeter. With high resolution lithography and suitably sized nanostructures, $\leq 10^7$ nanostructures per square centimeter can be achieved. Example devices include multiplexed sensor arrays, multi-wavelength emission devices such a LED arrays on a substrate, multiwavelength sensor devices, and customizable combinations of low noise and RF components on low cost substrates such as silicon. In all examples, an assembled microstructure can include a semiconductor active region for an electronic or optoelectronic device, and the material composition of the semiconductor active region can be selected independent of the substrate composition. Assembly of different species of semiconductor microstructure on a common substrate allows one or more component characteristics (such as semiconductor band gap) to be located at predetermined locations, under electrical field control during the deposition process.

Further Discussion of Applications

Examples of the present invention include improved methods of heterogeneously integrated Microsystems that can be used to fabricate improved biosensors. However, the approach is not limited to sensor applications. For the first time, heterogeneously integrated micro-systems can be assembled with precise spatial selectivity, e.g. with sub-micron precision in the location of nanostructures on the substrate. Different species of nanostructure can be selectively assembled within spatial regions defined by the application of electric fields between spaced-apart electrodes on the substrate.

Some examples include assembly of semiconductor microstructures that may be grown on lattice matched substrates, then assembled on another substrate (such as silicon) using methods described here. For example, the active semiconductor portion of an electronic or optoelectronic component (such as a laser, other light-emitting device, sensor, transistor, or other component) may be first grown on a substrate that is at least approximately lattice-matched to the semiconductor microstructure. The semiconductor microstructure may then be assembled on a different composition substrate, for example a substrate that is not lattice matched to the semiconductor microstructure.

In some examples, epitaxially grown device layers may be released from a separate growth substrate, and deposited as microstructures on a device substrate using the methods described herein. For example, active semiconductor microstructures for LEDs, photodetectors, transistors, or other devices may be assembled as microstructures on a substrate. In a representative example, narrow gap Sb-based semiconductor microstructures can be integrated with a silicon substrate. At present, there is no conventional problem-free approach to integration of anti-monide semiconductors with silicon.

Further representative example applications include assembly of non-silicon based lasers on a silicon substrate using microstructures comprising a laser active region. Other examples include assembly of low noise semiconductor components on a substrate comprising a different semiconductor (e.g. low noise transistors, such as GaAs, on a silicon substrate). This allows improved RF circuits, for example high power RF and/or low noise components integrated monolithically with a silicon substrate.

Examples of the present invention include various devices, such as a cantilevered resonator array. There are many other applications. Examples of the present invention include methods and apparatus formed using general assembly processes described herein used with any type of nanoelements (e.g. a dimension less than 1000 nm) and/or microelements.

Nanowire-based devices fabricated according to examples of the present invention allow improved integrated circuits (ICs) with additional functionality. These include chip-based sensor arrays using nanoelectromechanical (NEMS) resonators, having ultra-sensitive mass detection.

Examples of the invention include mass detectors, analyte detection, artificial noses, target compound detection, biological screening, radiation detector arrays, radiation source arrays, and the like. Nanostructures may be deposited on integrated circuit substrates, such as MOS, CMOS, and the like.

Examples of the present invention include a scanning microscope using an array of magnetic tipped nanowires. For example, nanowires may be grown having an elongated body and a magnetic tip. Microscopy or other sensing applications may use nanostructures responsive to magnetic fields, electric fields, radiation, chemical agents, biological agents, and the like. Nanowires used as resonators may be anchored at one end only, nanowires used as FETs or other devices may be anchored at two or more locations. Anchoring may refer to provision of electrical contacts.

Integrated circuits containing different types of thin film sensors and CMOS electronics allows on-chip sensor control and monitoring, response amplification and signal conditioning, and transmission of data off-chip. NWs may be connected to conducting tracks on an IC, for example a CMOS chip. Large quantities of different types of nanowires can be synthesized off-chip and assembled in parallel and at predefined locations on-chip. Selective binding of target biomolecule to nanowire-bound probes allows multi-analyte biosensor arrays. Integration of chemically-sensitive conducting polymer NWs allows cross-reactive chemical sensor arrays. Pattern recognition can be used to discriminate target analyte from response of diverse set of sensor elements. Off-chip synthesis of conducting polymer and metal oxide nanowires can be followed by chip-scale integration of NW FETs, chemoresistive sensors, etc.

Coupling biological molecules with devices on integrated circuit chips, for example using biologically-functionalized nanostructures, allows increased capabilities of such chips. Examples include integrated circuits including nanostructures for improved biosensing. For the first time, controlling the precise locations of different molecules and/or devices on a chip is possible using example approaches of the present invention. Spatially confined electric fields can be used to assemble different populations of DNA-coated nanowires at desired positions, with accuracy that enabled post-assembly fabrication of contacts to each individual nanowire, with high yield and without loss of DNA function. This combination of off-chip synthesis and biofunctionalization with high-density, heterogeneous assembly and integration at the individual nanowire level allows new ways of incorporating biological functionality with silicon electronics.

Examples of the present invention allow simple and highly effective methods for controlled assembly of multiple distinct populations of DNA-coated nanowires onto a patterned Si wafer. Effective coupling of chemical and biological functionality with the power of silicon integrated circuit chips can overturn current thinking about the capabilities of silicon electronics, overcome Moore's Law, and enable revolutionary new approaches to solving problems in chemistry, biology and medicine.

Examples of the present invention include methods and devices using one or more of the following features: (i) positioning of individual nanostructures to preexisting chip features, (ii) assembly of DNA-functionalized nanostructures on a silicon chip substrate, and/or (iii) assembly and integration of multiple differently-functionalized nanostructures to predetermined chip locations. Hence, biosensors responsive to a plurality of analytes can be fabricated using different functionalization of nanostructures positioned at different locations on a substrate.

In some examples, standard optical lithography can be used for substrate preparation, and no microfabrication methods are needed (e.g. no e-beam or no microfluidic channels are required). Fabrication costs are hence reduced. The DNA, other biomolecule, or other analytic agent disposed on the nanostructures can retain selective binding ability during fabrication, due to the mild process conditions used. Example approaches are also highly versatile, and can be adapted to incorporate different nanowire materials and coatings as well as different final device structures (e.g., field effect devices). The nanowire positioning with respect to other on-chip features is precise enough to enable conversion of the free nanostructures (such as nanowires) to on-substrate devices (such as nanocantilevers or FETs) via post-assembly lithographic processing.

Nanostructures can be delivered to the substrate surface using injection (e.g. between a cover slip and a surface), printing methods such as ink-jet printing, spray deposition, and the like. A substrate may have the deposition surface dipped into a fluid suspension of nanostructures.

Example methods of depositing structures (such as microstructures and/or nanostructures on a substrate include: using an electric field to attract the nanostructures towards the substrate; and providing positional registration, so as to locate the nanostructures at predetermined locations. Providing positional registration comprises providing topographic features in the substrate, such as wells. The electric field may be applied so as to align the nanostructures in a preferred orientation relative to the substrate, for example generally parallel to the substrate surface and aligned along an elongate well. The structures may be nanostructures, in particular nanowires, the wells being elongate, the electric field acting so as to align the nanowires alone a direction of elongation of the wells. The structures may be anchored to the substrate, for example using metal or other deposition after the fluid component of a fluid suspension of nanostructures is removed.

Defects may be removed by a lift-off process, where defects include nanostructures located at other than predetermined locations. The substrate comprising a pair of spaced apart electrodes, for example as provided by interdigitated electrodes, for provision of electric fields during the assembly process. Electrodes may be covered with a dielectric layer. A substrate may comprise an integrated circuit, such as a CMOS circuit on silicon.

The invention is not restricted to the illustrative examples described herein. Examples described are exemplary, and are not intended to limit the scope of the invention. Changes therein, other combinations of elements, and other uses will occur to those skilled in the art. The scope of the invention is defined by the scope of the claims.

Having described our invention, we claim:

1. A method of assembling structures at predetermined locations on a substrate surface, the method comprising:
   providing a substrate assembly, the substrate assembly having the substrate surface,
   the substrate assembly including spaced-apart electrodes, the spaced-apart electrodes including a pair of electrodes having an electrode gap therebetween,
   the pair of electrodes being covered by a dielectric layer,
   the substrate assembly further having topographic features, the topographic features being depressions in the substrate surface;
   exposing the substrate surface to a fluid suspension of the structures; and
   applying an alternating voltage between the spaced-apart electrodes so as to attract the structures towards the substrate surface,
   the topographic features locating the structures at the predetermined locations on the substrate surface,
   the alternating voltage inducing an electric field, the electric field having electric field gradients that preferentially attract the structures to the depressions in the substrate surface,
   the structures being centered relative to the electrode gap by electrostatic forces between the structures and the spaced-apart electrodes,
   positional registration of the structures on the substrate surface being provided by the topographic features.

2. The method of claim 1, the structures being nanostructures having at least one dimension less than 1 micron.

3. The method of claim 1, the structures having a shape anisotropy of at least 2:1.

4. The method of claim 1, the structures being attracted to the substrate surface by a dielectrophoretic force induced by the alternating voltage.

5. The method of claim 1, wherein the depressions are wells having an elongation direction, the electric field being applied generally parallel to the elongation direction.

6. The method of claim 5,
   the structures being elongate, the electric field aligning the structures with the elongation direction of the wells.

7. The method of claim 1, the topographic features being formed in a sacrificial dielectric layer.

8. The method of claim 7,
   the method further comprising connecting the structures at the predetermined locations by forming an electrical connection between the structures and at least one of the spaced-apart electrodes.

9. The method of claim 7, further comprising removing structures at locations other than the predetermined locations by selectively removing the sacrificial dielectric layer using a lift-off process.

10. The method of claim 1, wherein the spaced-apart electrodes are provided by interdigitated electrodes.

11. The method of claim 1, the substrate including electronic components, the topographic features positioning the structures relative to the electronic components with a positional accuracy of less than 1 micron.

12. The method of claim 11, the electronic components being CMOS electronic components.

13. The method of claim 1, further comprising chemically or biochemically functionalizing the structures before assembly of the structures on the substrate,
   the method being used to provide an array of analyte-sensitive elements on the substrate.

14. The method of claim 1, the method providing an array of structures on the surface,
   the array of structures having a surface density of at least 1,000,000 elements per square centimeter.

15. The method of claim 1, the structures being selected from a group of structures consisting of wires, disks, tubes, rings, spheroids, and sheets,
   the substrate comprising a substrate material selected from a group of substrate materials consisting of semiconductors, inorganic dielectrics, glasses, ceramics, and polymers.

16. The method of claim 1, the structures comprising graphene sheets.

17. An apparatus fabricated using the method of claim 1, the apparatus being an electronic device, an optoelectronic device, or an analyte sensor.

18. A method of assembling a plurality of structures at predetermined locations on a substrate, the plurality of structures including at least a first structure species and a second structure species, the method comprising:
   providing the substrate, the substrate having a substrate surface and including a plurality of electrodes, the electrodes being located below the substrate surface and covered by a dielectric layer;
   exposing the substrate to a fluid suspension of the first structure species;
   applying a first alternating voltage to a first set of electrodes from the plurality of electrodes, so as to assemble the first structure species at a first set of predetermined locations,
   the first set of predetermined locations being defined by a first set of depressions in the substrate surface;
   exposing the substrate to a fluid suspension of the second structure species; and
   applying a second alternating voltage to a second set of electrodes from the plurality of electrodes, so as to assemble the second structure species at a second set of predetermined locations,
   the second set of predetermined locations being defined by a second set of depressions in the surface,
   thereby assembling the plurality of structures at predetermined locations on the substrate,
   positional registration of the first structure species being provided by the first set of topographic features,
   positional registration of the second structure species being provided by the second set of topographic features.

19. The method of claim 18, each structure species having a different chemical or biochemical functionality,
   functionalization of the structure species being achieved before exposing the substrate to a fluid suspension of the structure species.

20. The method of claim 19, structure species being functionalized using DNA before exposing the substrate to a fluid suspension of the structure species.

21. The method of claim 19, the method being used to assemble a multi-analyte sensor.

22. The method of claim 18, each structure species having a different semiconductor composition, the method being used to assemble an electronic device or optoelectronic device.

23. The method of claim 18, the method further comprising:
  preparing at least one structure species by growth on a different substrate.

24. A method of assembling structures at predetermined locations on a substrate surface, the method comprising:
  providing a substrate, the substrate having the substrate surface,
  the substrate including spaced-apart electrodes, the spaced-apart electrodes including a pair of electrodes with an electrode gap therebetween,
  the pair of electrodes being buried below the substrate surface by a dielectric layer,
  the substrate further having topographic features, the topographic features being depressions in the substrate surface,
  the depressions being formed in a sacrificial dielectric layer;
  exposing the substrate to a fluid suspension of the structures;
  applying an electric field between the spaced-apart electrodes so as to attract the structures towards the substrate,
  the topographic features locating the structures at the predetermined locations, so as to assemble the structures at the predetermined locations; and
  selectively removing the sacrificial dielectric layer, leaving the structures located at the predetermined locations,
  the substrate including electronic components, the structures being in electrical communication with the electronic components after assembly at the predetermined locations,
  the positional accuracy of assembled structures relative to at least one electronic component being less than 1 micron.

25. The method of claim 24, the structures being nanostructures having at least one dimension less than 1 micron.

26. The method of claim 25, the structures being nanowires.

27. The method of claim 24, the method further comprising:
  connecting the structures to the substrate so as to provide mechanical resonators, and
  providing an electronic circuit operable to detect a change in mechanical properties of the mechanical resonators in response to an analyte.

28. The method of claim 24, further comprising:
  connecting the structures to the substrate so as to provide chemoresistive elements, and
  providing an electronic circuit operable to detect a change in electrical properties of the chemoresistive elements in response to an analyte.

29. The method of claim 24, the structures including a semiconductor, the method further comprising:
  preparing the structures by growth on a different substrate; and
  removing the structures from the different substrate, so as allow preparation of the fluid suspension of the structures.

\* \* \* \* \*

UNITED STATES PATENT AND TRADEMARK OFFICE
CERTIFICATE OF CORRECTION

| | | |
|---|---|---|
| PATENT NO. | : 8,361,297 B2 | |
| APPLICATION NO. | : 12/351509 | |
| DATED | : January 29, 2013 | |
| INVENTOR(S) | : Mayer et al. | |

It is certified that error appears in the above-identified patent and that said Letters Patent is hereby corrected as shown below:

In the Specification:

Column 2, line 60, Delete "-" in polyethylenedioxythiophene

Column 7, line 10, Delete "-" in photoresist

Column 8, line 18, Delete "-" in devices

Column 8, line 25, Delete "-" in delivery

Column 8, line 59, Delete "-" in misaligned

Column 9, line 1, Delete "malting", Insert --making--

Column 9, line 45, Delete "-" in However

Column 9, line 62, Delete "-" in nanowires

Column 12, line 33, Delete "-" in Microposit

Column 12, line 42, Delete "imagine", Insert --imaging--

Column 13, line 22, Delete "Microsystems", Insert --microsystems--

Column 13, line 24, Delete "-" in Microsystems

Column 14, line 13, Delete ",UV and BV", Insert --,HIV and HBV--

Column 15, line 35, Delete "chance", Insert --change--

Signed and Sealed this
Thirtieth Day of June, 2015

Michelle K. Lee
*Director of the United States Patent and Trademark Office*

CERTIFICATE OF CORRECTION (continued)
U.S. Pat. No. 8,361,297 B2

Column 16, line 25, Delete "-" in described

Column 16, line 41, Delete "Electric-Field", Insert --Electric-field--

Column 18, line 22, Delete "Assembly.", Insert --Assembly--

Column 22, line 66, Delete "-" in providing

Column 24, line 26, Delete "-" in multiwavelength

Column 24, line 26, Delete "A LED", Insert --As LED--

Column 24, line 41, Delete "Microsystems", Insert --microsystems--

Column 24, line 44, Delete "-" in microsystems

Column 25, line 5, Delete "-" in antimode

Column 26, line 59, Delete "alone", Insert --along--